(12) United States Patent
Smythe et al.

(10) Patent No.: US 8,530,878 B2
(45) Date of Patent: Sep. 10, 2013

(54) MEMORY ARRAYS AND METHODS OF FORMING MEMORY CELLS

(71) Applicant: Micron Technology, Inc., Boise, ID (US)

(72) Inventors: John Smythe, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/781,457

(22) Filed: Feb. 28, 2013

(65) Prior Publication Data

US 2013/0193403 A1   Aug. 1, 2013

Related U.S. Application Data

(62) Division of application No. 12/886,283, filed on Sep. 20, 2010, now Pat. No. 8,409,915.

(51) Int. Cl.
*H01L 47/00* (2006.01)
*H01L 29/06* (2006.01)

(52) U.S. Cl.
USPC ...... 257/4; 257/5; 257/E31.029; 257/E45.001

(58) Field of Classification Search
USPC ................ 257/2, 4, 5, E31.029, E45.001
See application file for complete search history.

(56) References Cited

U.S. PATENT DOCUMENTS

| | | | |
|---|---|---|---|
| 6,887,792 B2 | 5/2005 | Perlov et al. | |
| 7,365,382 B2 | 4/2008 | Willer et al. | |
| 7,435,648 B2 | 10/2008 | Hsu et al. | |
| 7,449,354 B2 | 11/2008 | Merchant et al. | |
| 7,888,711 B2 | 2/2011 | Cheung et al. | |
| 8,222,627 B2 * | 7/2012 | Kuo et al. | 257/3 |
| 2006/0124916 A1 | 6/2006 | Lung | |
| 2008/0096375 A1 | 4/2008 | Chen | |
| 2008/0224116 A1 * | 9/2008 | Peters | 257/3 |
| 2009/0250681 A1 | 10/2009 | Smythe et al. | |
| 2009/0272960 A1 | 11/2009 | Srinivasan et al. | |
| 2009/0317540 A1 | 12/2009 | Sandhu et al. | |
| 2011/0199814 A1 | 8/2011 | Meade | |
| 2011/0199815 A1 | 8/2011 | Meade et al. | |

OTHER PUBLICATIONS

Kau et al., "A stackable cross point phase change memory", IEEE Xplore, 2009, pp. 27.1.1-27.1.4.
Meyer et al., "Oxide Dual-Layer Memory Element for Scalable Non-Volatile Cross-Point Memory Technology", IEEE Xplore, 2008, pp. 1-5.

* cited by examiner

*Primary Examiner* — Lex Malsawma
(74) *Attorney, Agent, or Firm* — Wells St. John P.S.

(57) ABSTRACT

Some embodiments include methods of forming memory cells utilizing various arrangements of conductive lines, electrodes and programmable material; with the programmable material containing high k dielectric material directly against multivalent metal oxide. Some embodiments include arrays of memory cells, with the memory cells including programmable material containing high k dielectric material directly against multivalent metal oxide.

11 Claims, 42 Drawing Sheets

MEMORY ARRAYS AND METHODS OF FORMING MEMORY CELLS

RELATED PATENT DATA

This patent resulted from a divisional of U.S. patent application Ser. No. 12/886,283, which was filed Sep. 20, 2010, and which is hereby incorporated herein by reference.

TECHNICAL FIELD

Memory arrays and methods of forming memory cells.

BACKGROUND

Memory is often incorporated into integrated circuitry. The memory may be used, for example, in computer systems for storing data.

Memory may be fabricated as an array of individual memory cells, with each memory cell being configured to retain or store memory in at least two different selectable states. In a binary system, the storage conditions are considered as either a "0" or a "1".

Individual memory cells might be volatile, semi-volatile, or nonvolatile. Nonvolatile memory cells can store data for extended periods of time, and many types of nonvolatile memory cells can maintain data storage even in the absence of power. In contrast, volatile memory dissipates and is therefore refreshed/rewritten to maintain data storage.

Integrated circuitry fabrication continues to strive to produce smaller and denser integrated circuits. There is a continuing effort to reduce the number of components in individual devices because such can reduce the size of finished constructions, and can simplify processing. The smallest and simplest memory cell will likely be comprised of two conductive electrodes having a programmable material received between them.

Suitable programmable materials have two or more selectable resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

Programmable materials that are receiving increasing interest are materials containing multiple discrete layers. Example multi-layer programmable materials are dual-layer materials containing two different oxide layers. Such dual-layer materials may be programmed by moving oxygen species (for instance, oxygen ions) within and between the layers of the materials.

The utilization of multi-layer programmable materials can provide advantages in nonvolatile memory applications. For instance, the multi-layer programmable materials may enable specific memory states to be tailored for particular applications. However, although multi-layer programmable materials show promise for utilization in nonvolatile memory architectures, there remain challenges in incorporating such materials into integrated circuitry.

BRIEF DESCRIPTION OF THE DRAWINGS

FIG. 1C is along the line 1C-1C of FIG. 1B, and FIG. 1B is along the line 1B-1B of FIG. 1C.

FIG. 2C is along the line 2C-2C of FIG. 2B, and FIG. 2B is along the line 2B-2B of FIG. 2C.

FIG. 3C is along the line 3C-3C of FIG. 3B, and FIG. 3B is along the line 3B-3B of FIG. 3C.

FIG. 4C is along the line 4C-4C of FIG. 4B, and FIG. 4B is along the line 4B-4B of FIG. 4C.

FIG. 5C is along the line 5C-5C of FIG. 5B, and FIG. 5B is along the line 5B-5B of FIG. 15.

FIG. 8C is along the line 8C-8C of FIG. 8B, and FIG. 8B is along the line 8B-8B of FIG. 8C.

FIG. 9C is along the line 9C-9C of FIG. 9B, and FIG. 9B is along the line 9B-9B of FIG. 9C.

FIG. 10C is along the line 10C-10C of FIG. 10B, and FIG. 10B is along the line 10B-10B of FIG. 10C.

FIG. 11C is along the line 11C-11C of FIG. 11B, and FIG. 11B is along the line 11B-11B of FIG. 11C.

FIG. 12C is along the line 12C-12C of FIG. 12B, and FIG. 12B is along the line 12B-12B of FIG. 12C.

FIG. 13C is along the line 13C-13C of FIG. 13B, and FIG. 13B is along the line 13B-13B of FIG. 13C.

FIG. 14C is along the line 14C-14C of FIG. 14B, and FIG. 14B is along the line 14B-14B of FIG. 14C.

FIG. 15C is along the line 15C-15C of FIG. 15B, and FIG. 15B is along the line 15B-15B of FIG. 15C.

FIG. 16C is along the line 16C-16C of FIG. 16B, and FIG. 16B is along the line 16B-16B of FIG. 16C.

FIG. 17C is along the line 17C-17C of FIG. 17B, and FIG. 17B is along the line 17B-17B of FIG. 17C.

FIG. 18C is along the line 18C-18C of FIG. 18B, and FIG. 18B is along the line 18B-18B of FIG. 18C.

FIG. 19C is along the line 19C-19C of FIG. 19B, and FIG. 19B is along the line 19B-19B of FIG. 19C.

FIG. 20C is along the line 20C-20C of FIG. 20B, and FIG. 20B is along the line 20B-20B of FIG. 20C.

FIG. 22C is along the line 22C-22C of FIG. 22B, and FIG. 22B is along the line 22B-22B of FIG. 22C.

FIG. 23C is along the line 23C-23C of FIG. 23B, and FIG. 23B is along the line 23B-23B of FIG. 23C.

DETAILED DESCRIPTION OF THE ILLUSTRATED EMBODIMENTS

Multi-layer programmable materials may be incorporated into integrated memory as cross-point memory cells, with such memory cells having the programmable material directly between a pair of electrodes.

It is desired to fabricate integrated memory as large arrays of individually-programmable memory cells. There can be numerous challenges associated with the fabrication of such large memory arrays. For instance, there may be challenges in designing appropriate architecture so that an array is highly integrated (i.e., has a small footprint over a supporting semiconductor substrate), while still enabling each individual memory cell to be individually programmed. Also, there may be challenges in designing a fabrication process to have desired high-throughput, low-cost, and low error rate. Many of the embodiments described below are tailored to develop improved methods and architectures for incorporating multi-layer programmable materials into integrated memory.

A first embodiment is described with reference to FIGS. 1-5.

Figure 1A:
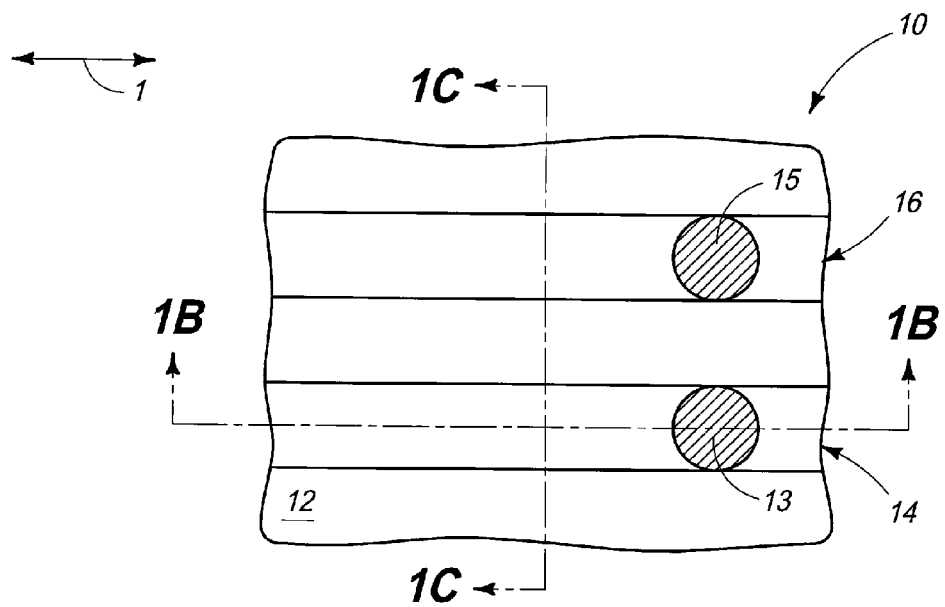
FIG. 1A is a diagrammatic top view of a portion of a semiconductor construction at a process stage of an example embodiment process for forming a memory array.
Figure 1B:
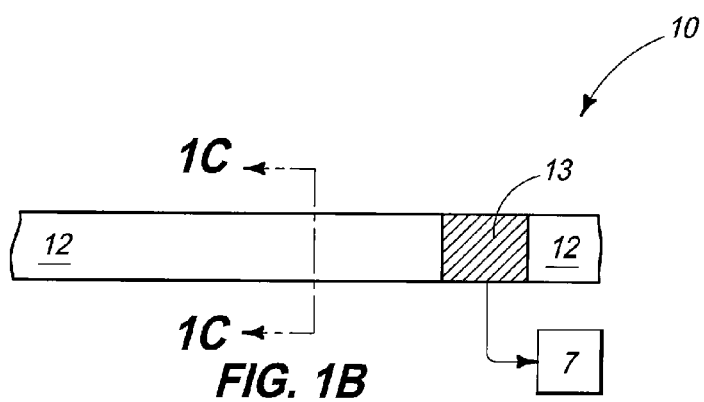
FIGS. 1B and 1C are diagrammatic cross-sectional side views along the lines 1B-1B and 1C-1C, respectively, of FIG. 1A. Also.
Figure 1C:
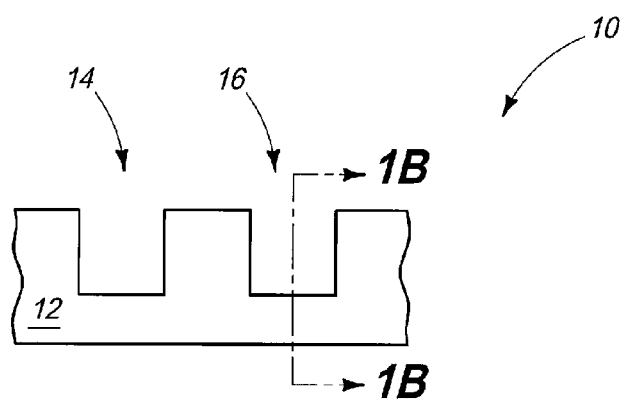

Referring to FIG. 1, such illustrates three views of a semiconductor construction 10. FIG. 1A is a top view of the construction, and FIGS. 1B and 1C are cross-sectional side views along the lines 1B-1B and 1C-1C, respectively.

The construction 10 includes a dielectric material 12 having a pair of trenches 14 and 16 formed therein. The illustrated trenches are parallel to one another, and extend along an axis 1. Electrical interconnects 13 and 15 (e.g., plugs) extend through dielectric material 12 and are exposed at the bottoms of trenches 14 and 16.

Dielectric material 12 may comprise any suitable electrically insulative composition or combination of electrically insulative compositions; and in some embodiments may comprise, consist essentially of, or consist of one or more of silicon dioxide, various doped silicon oxides (e.g., borophosphosilicate glass, phosphosilicate glass, fluorosilicate glass, etc.), silicon nitride, etc. The dielectric material may be supported over a semiconductor substrate (not shown). The semiconductor substrate may include a semiconductor material (for instance, a monocrystalline silicon material) and various levels of integrated circuitry supported by the semiconductor material. Such integrated circuitry may include, for example, CMOS or other circuitry configured for addressing individual memory cells formed in accordance with the methodologies described herein. The interconnects 13 and 15 may be electrically connected with such addressing circuitry, as diagrammatically illustrated in FIG. 1B as an electrical connection to circuitry 7.

Trenches 14 and 16 may be formed with any suitable processing. For instance, the trenches may be formed by providing a photolithographically-patterned mask (not shown) over dielectric material 12, transferring a pattern from the mask into material 12 with one or more etches to form the trenches 14 and 16, and then removing the mask to leave the construction shown in FIG. 1.

Figure 2A:
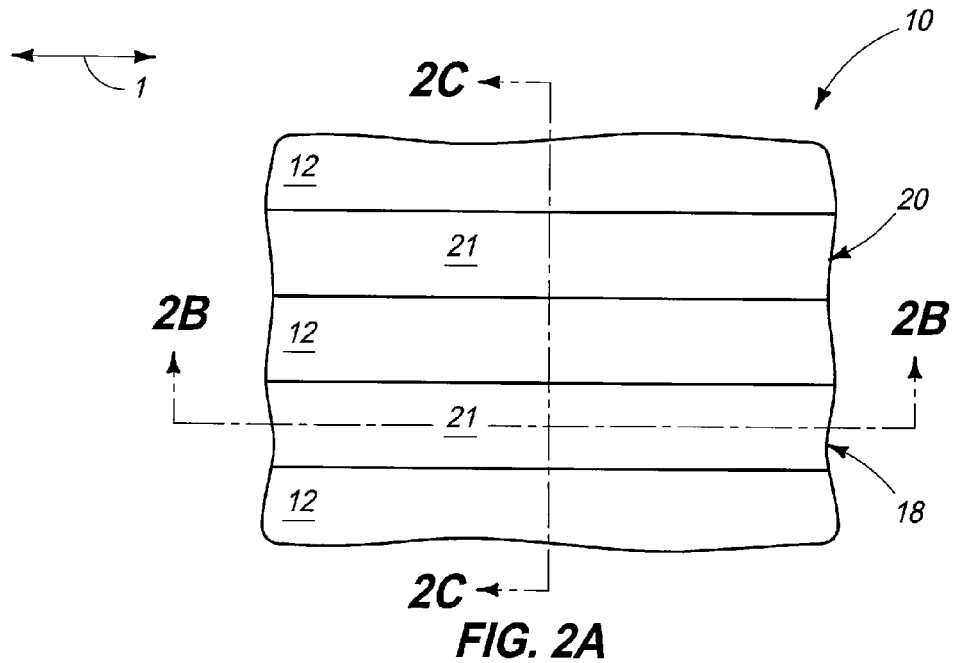
FIG. 2A is a diagrammatic top view of a portion of a semiconductor construction at a process stage subsequent to that of FIG. 1A of an example embodiment process for forming a memory array.
Figure 2B:
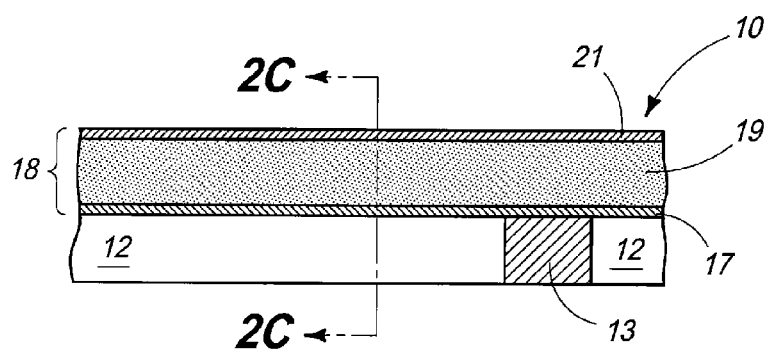
FIGS. 2B and 2C are diagrammatic cross-sectional side views along the lines 2B-2B and 2C-2C, respectively, of FIG. 2A. Also.
Figure 2C:
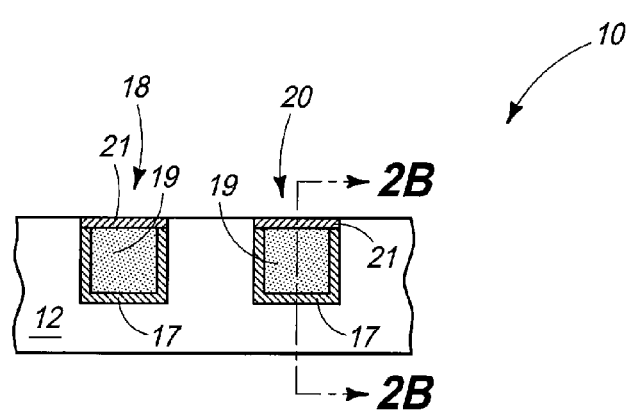

Referring to FIG. 2, construction 10 is shown at a processing stage subsequent to that of FIG. 1. Specifically, conductive lines 18 and 20 are formed within the trenches 14 and 16 (FIG. 1), respectively; with such lines extending along the first axis 1. In the shown embodiment the conductive lines comprise barrier layers 17 along the sidewalls and bottoms of the trenches, electrically conductive cores 19 within the trenches and over the barrier layers, and liners 21 over the cores. The lines 18 and 20 may be formed by conventional damascene processing. The barrier layers 17 may comprise any suitable materials, and in some embodiments may comprise, consist essentially of, or consist of, for example, tantalum/copper or ruthenium/copper. The cores 19 may comprise any suitable materials, or combinations of materials, and in some embodiments may comprise, consist essentially of, or consist of copper. The liners 21 may comprise any suitable materials or combinations of materials, and in some embodiments may comprise, consist essentially of, or consist of tantalum nitride or titanium nitride.

The electrically conductive lines 18 and 20 are examples of conductive lines that may be utilized. Any suitable electrically conductive lines may be utilized, including lines which include other materials and configurations besides those specifically shown.

Figure 3A:
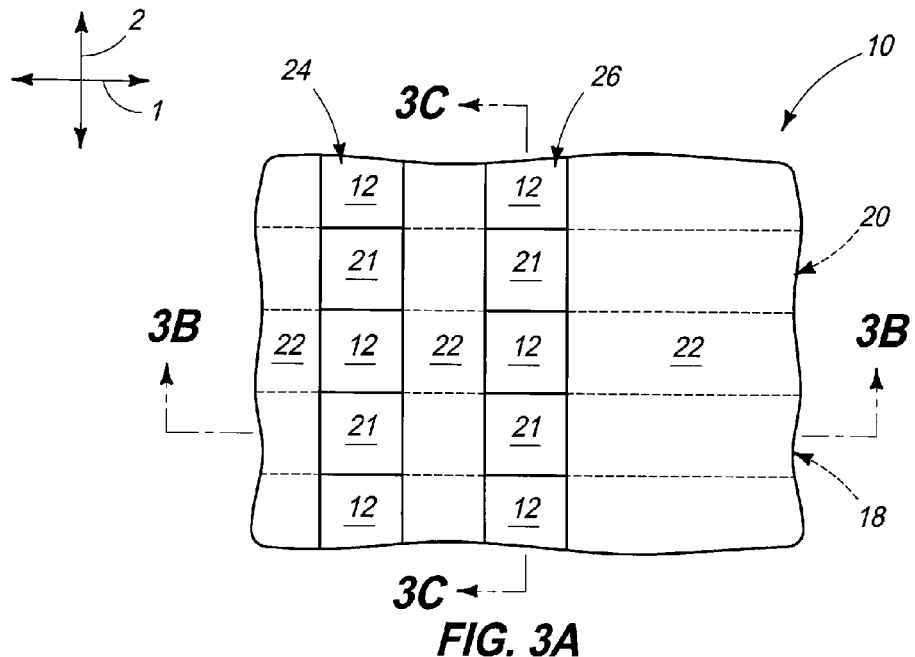
FIG. 3A is a diagrammatic top view of a portion of a semiconductor construction at a process stage subsequent to that of FIG. 2A of an example embodiment process for forming a memory array.
Figure 3B:
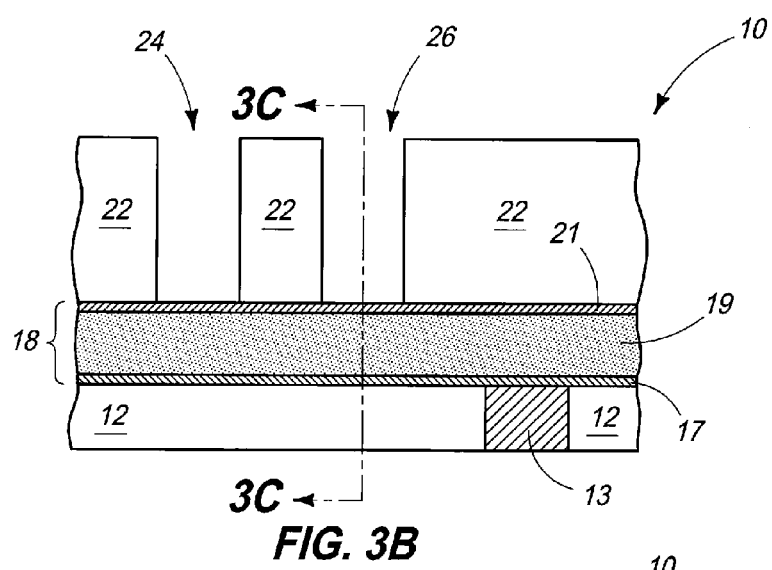
FIGS. 3B and 3C are diagrammatic cross-sectional side views along the lines 3B-3B and 3C-3C, respectively, of FIG. 3A. Also.
Figure 3C:
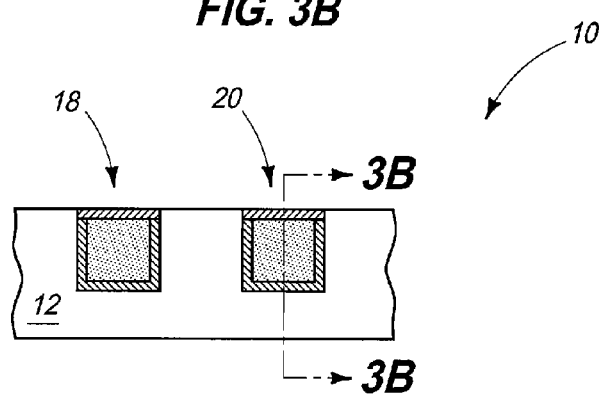

Referring to FIG. 3, a dielectric material 22 is formed across lines 18 and 20, and across the dielectric material 12. The dielectric materials 12 and 22 may be referred to as first and second dielectric materials, respectively, to distinguish such dielectric materials from one another.

The dielectric material 22 may comprise any suitable composition or combination of compositions, and in some embodiments may comprise one or more of the materials discussed above with reference to the dielectric material 12. The dielectric material 22 may have the same composition as dielectric material 12, or may be compositionally different from dielectric material 12.

Regions of the lines 18 and 20 are shown with dashes in the top view of FIG. 3A to indicate that such regions are beneath dielectric material 22.

A pair of trenches 24 and 26 extend through dielectric material 22 to expose upper surfaces of lines 18 and 20 (specifically, to expose the liner 21 of the lines 18 and 20 in the shown embodiment). The trenches 24 and 26 may be formed by any suitable methodology, including, for example, photolithographic processing analogous to that described above with reference to FIG. 1. The trenches 24 and 26 extend along a second axis 2 which intersects the first axis 1. In the shown embodiment, the second axis 2 is substantially orthogonal to the first axis 1, with the term "substantially orthogonal" meaning that the first and second axes are orthogonal to within tolerances of fabrication and measurement.

Referring to FIG. 4, electrode material 25 is formed at the bottoms of trenches 24 and 26, and directly over conductive lines 18 and 20. The electrode material 25 may comprise any suitable composition or combination of compositions, and in some embodiments may comprise, consist essentially of, or consist of platinum. The electrode material 25 may be referred to as a first electrode material to distinguish such electrode material from other electrode materials that are subsequently formed (discussed below).

Figure 4A:
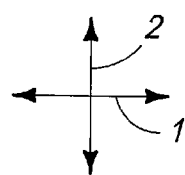
FIG. 4A is a diagrammatic top view of a portion of a semiconductor construction at a process stage subsequent to that of FIG. 3A of an example embodiment process for forming a memory array.
Figure 4A:
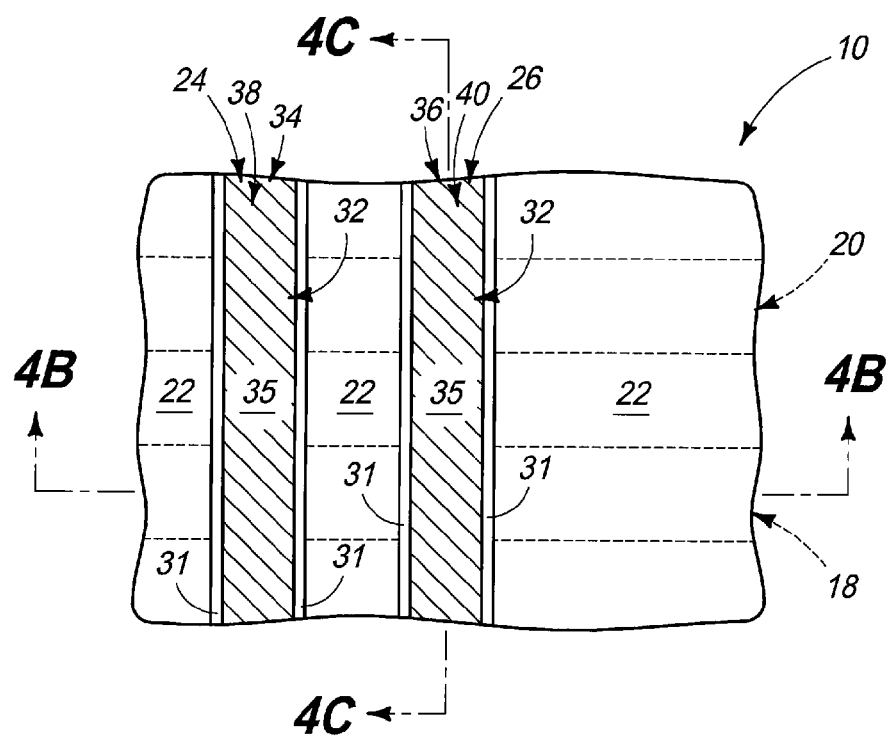
Figure 4B:
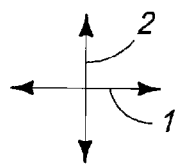
FIGS. 4B and 4C are diagrammatic cross-sectional side views along the lines 4B-4B and 4C-4C, respectively, of FIG. 4A. Also.
Figure 4B:
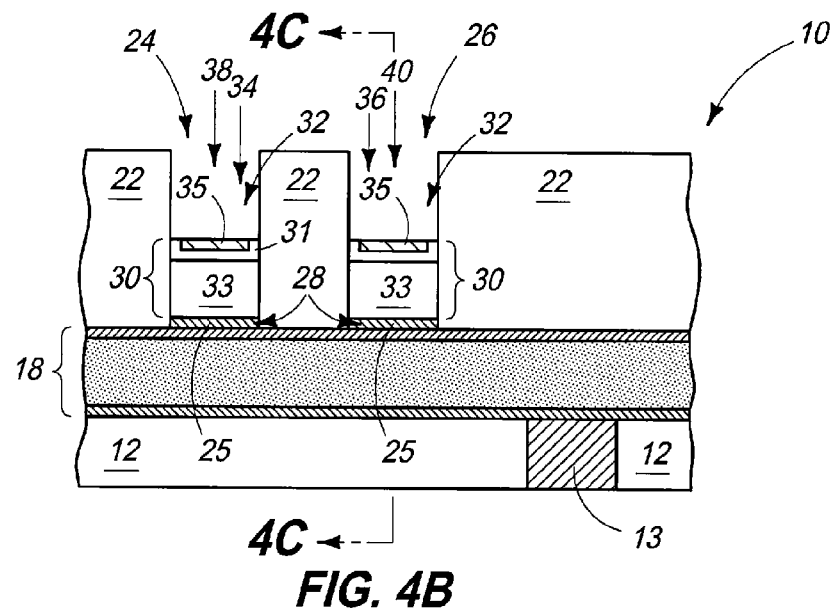
Figure 4C:
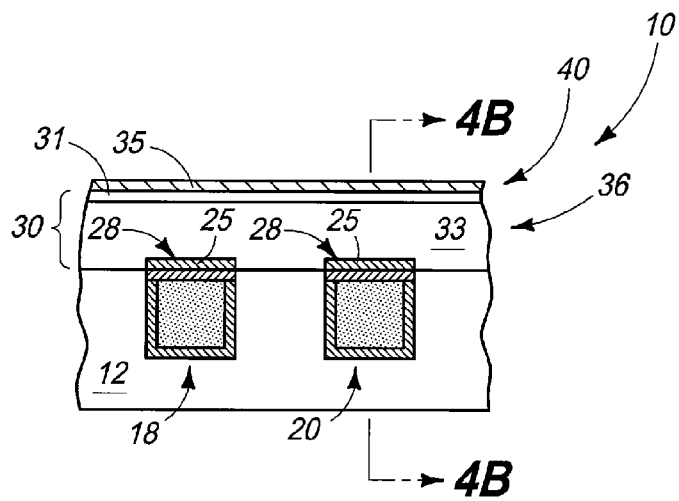
Figure 5A:
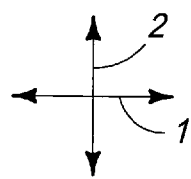
FIG. 5A is a diagrammatic top view of a portion of a semiconductor construction at a process stage subsequent to that of FIG. 4A of an example embodiment process for forming a memory array.
Figure 5A:
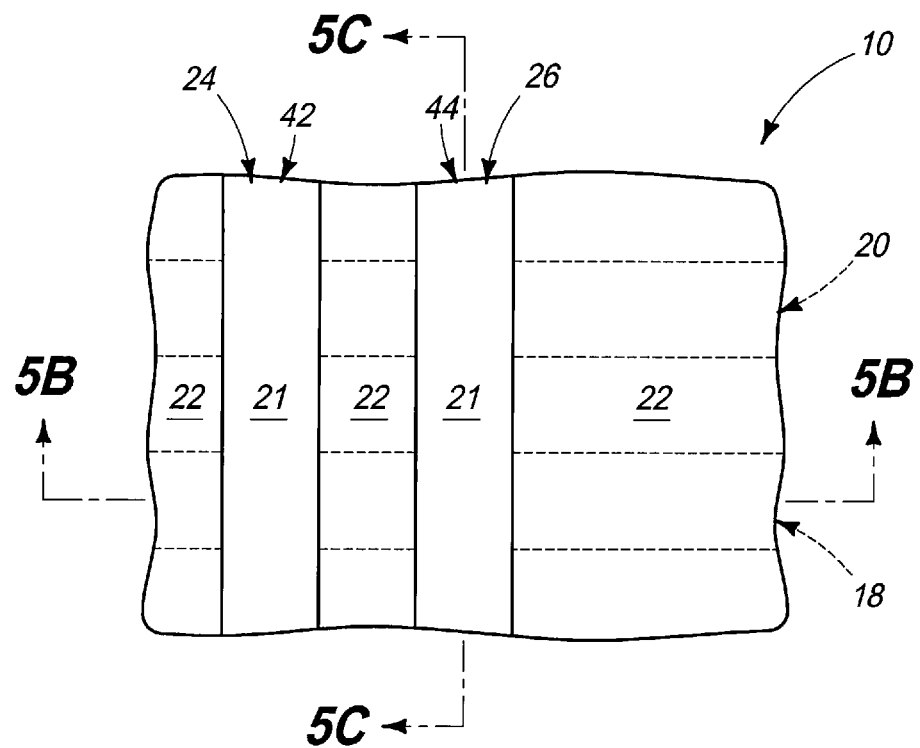
Figure 5B:
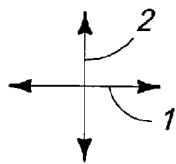
FIGS. 5B and 5C are diagrammatic cross-sectional side views along the lines 5B-5B and 5C-5C, respectively, of FIG. 5A. Also.
Figure 5B:
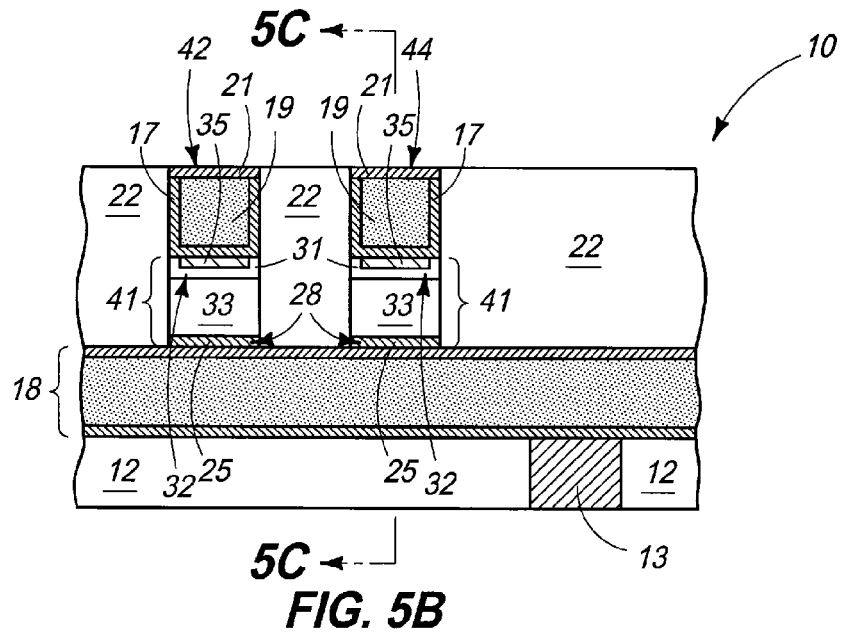
Figure 5C:
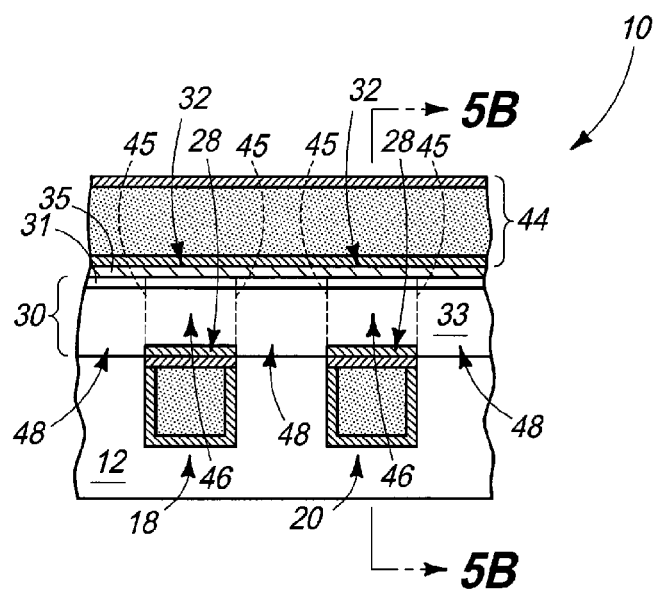

The electrode material 25 is patterned as spaced-apart segments along the bottoms of trenches 24 and 26, with such segments being only over conductive lines 18 and 20 (as shown in FIG. 4C relative to the segments of material 25 along the bottom of trench 26). Such spaced-apart segments correspond to a plurality of bottom electrodes 28. The electrode material 25 may be formed in the shown configuration utilizing any suitable processing. For instance, the electrode material may be selectively deposited on the conductive material of lines 18 and 20 relative to dielectric material at the bottoms of trenches 24 and 26. Alternatively, the electrode material may be non-selectively deposited across the bottoms of trenches 24 and 26, and then patterned into the desired segments utilizing a sacrificial mask (not shown) and one or more suitable etches.

Programmable material 30 is formed within trenches 24 and 26. Such programmable material comprises two portions; with one of the portions being a high k dielectric material 31, and the other being a multivalent metal oxide material 33 which is directly against the high k dielectric material. The programmable material 30 forms a pair of lines 34 and 36 within the trenches 24 and 26, respectively. Such programmable material lines are spaced apart from one another by regions of dielectric material 22, and extend along the second axis 2. In the shown embodiment the multivalent metal oxide 33 of the programmable material is directly against the bottom electrodes 28.

The multivalent metal oxide 33 may comprise any suitable composition or combination of compositions, and in some embodiments may comprise, consist essentially of, or consist of one or more of barium, ruthenium, strontium, titanium, calcium, manganese, praseodymium, lanthanum and samarium. For instance, the multivalent metal oxide may comprise, consist essentially of, or consist of calcium manganese oxide doped with one or more of Pr, La, Sr and Sm.

The high k dielectric material 31 may comprise any suitable composition or combination of compositions, and in some embodiments may comprise, consist essentially of, or consist of one or more high k oxides. For instance, the high k dielectric material may comprise, consist essentially of, or consist of an oxide which includes one or more of hafnium, zirconium, yttrium, and aluminum; and in some embodiments may comprise, consist essentially of, or consist of yttrium-doped zirconium oxide (YZO).

The materials 31 and 33 of the programmable material 30 may be formed to any suitable thicknesses. In some embodiments the multivalent metal oxide material 33 is formed to a thickness of from about 200 angstroms to about 1000 angstroms, and the high k dielectric material 31 is formed to a thickness of less than or equal to about 50 angstroms. Thus, the thickness of the high k dielectric material 31 may be less than or equal to about one-fourth of a thickness of the multivalent metal oxide 33 in some embodiments.

A second electrode material 35 is formed within trenches 24 and 26, and over the programmable material 30. The second electrode material 35 may comprise any suitable composition or combination of compositions, and in some embodiments may comprise, consist essentially of, or consist of platinum. The second electrode material forms top electrodes 32 across the programmable material.

The second electrode material 35 forms a pair of lines 38 and 40 that extend along the lines 34 and 36 of programmable material 30, and that are directly against the high k dielectric material 31 of such programmable material.

The programmable material 30 and second electrode material 35 may be formed within trenches 24 and 26 utilizing any suitable processing. For instance, the materials 31, 33 and 35 may be deposited utilizing one or more of atomic layer deposition (ALD), chemical vapor deposition (CVD), and physical vapor deposition (PVD); and then the materials 31, 33 and 35 may be patterned to be within the trenches utilizing a sacrificial mask (not shown) and one or more suitable etches and/or polishes.

In the shown embodiment the high k material 31 has a configuration of an upwardly-opening container, and the second electrode material 35 is contained within such container. Such configuration may be achieved by filling lower portions of trenches 24 and 26 with multivalent metal oxide 33 to leave unfilled upper portions of the trenches, lining the upper portions of the trenches with high k dielectric material 31, depositing second electrode material 35 within the lined upper portions of the trenches, and then conducting appropriate masking, etching and/or polishing to achieve the shown configuration.

Referring to FIG. 5, electrically conductive lines 42 and 44 are formed within trenches 24 and 26, respectively. The electrically conductive lines 42 and 44 comprise the same materials 17, 19 and 21 discussed above with reference to lines 18 and 20, and may be formed by a conventional damascene process. Although conductive lines 42 and 44 are shown to comprise the same materials as the conductive lines 18 and 20, in other embodiments conductive lines 42 and 44 may comprise different materials than those of conductive lines 18 and 20. The conductive lines 42 and 44 may be referred to as second conductive lines to distinguish them from the first conductive lines 18 and 20.

Conductive lines 42 and 44 are directly against top electrodes 32, and are also directly against upper portions of high k dielectric material 31 in the shown embodiment. The conductive lines 42 and 44 are formed in the same trenches (24 and 26) as the lines of programmable material 30, and thus are in one-to-one correspondence with the lines of programmable material. Since the conductive lines 42 and 44 are formed within trenches 24 and 26, the conductive lines extend along the axis 2. Thus, the conductive lines 42 and 44 extend along a direction orthogonal to the direction of the conductive lines 18 and 20 in the shown embodiment.

In some embodiments the lines 18 and 20 may be considered to be representative of a first series of lines while the lines 42 and 44 are considered to be representative of a second series of lines. One of the first and second series of lines may correspond to bitlines, while the other corresponds to wordlines. Memory cells 41 are defined at locations where the wordlines and bitlines cross one another, with each memory cell having a bottom electrode 28, a top electrode 32, and programmable material 30 directly between the top and bottom electrodes. The regions of programmable material 30 that are directly between top and bottom electrodes may be referred to as cell regions, while regions of programmable material 30 that are not directly between top and bottom electrodes may be referred to as intervening regions. The cell regions and intervening regions of the programmable material 30 are labeled in FIG. 5C as regions 46 and 48, respectively; and dashed lines 45 are provided to diagrammatically illustrate boundaries between the cell regions and the intervening regions.

The memory cells 41 form a memory array across construction 10. Such memory array may have thousands, millions, or more substantially identical memory cells.

In operation, each of the lines 18, 20, 42 and 44 may be connected to circuitry peripheral to the memory array, and each memory cell of the memory array may be uniquely addressed by the combination of one line from the first series (i.e., one of lines 18 and 20), and one line from the second series (i.e., one of lines 42 and 44). Voltage may thus be applied to individual memory cells to SET or RESET the memory cells. In some embodiments, the programming of programmable material 30 may comprise moving oxygen species within and/or between the layers 31 and 33 to alter electrical resistance of the material.

Some of the compositions suitable for utilization in programmable material 30 correspond to phase change materials. Such compositions can exist in either an amorphous phase or a crystalline phase, with the crystalline phase generally having higher conductivity than the amorphous phase. If phase change materials are utilized for programmable material 30, it may be advantageous to amorphize the programmable material within intervening regions 48 to reduce or eliminate cross-talk between adjacent memory cells. For instance, argon or other suitable dopant may be implanted into the intervening regions 48 to force the programmable material within such intervening regions into an amorphous phase.

Figure 6:
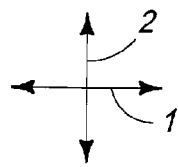
FIG. 6 is a diagrammatic cross-sectional side view of a semiconductor wafer construction at a processing stage subsequent to that of FIGS. 5A-5C in accordance with an example embodiment.
Figure 6:
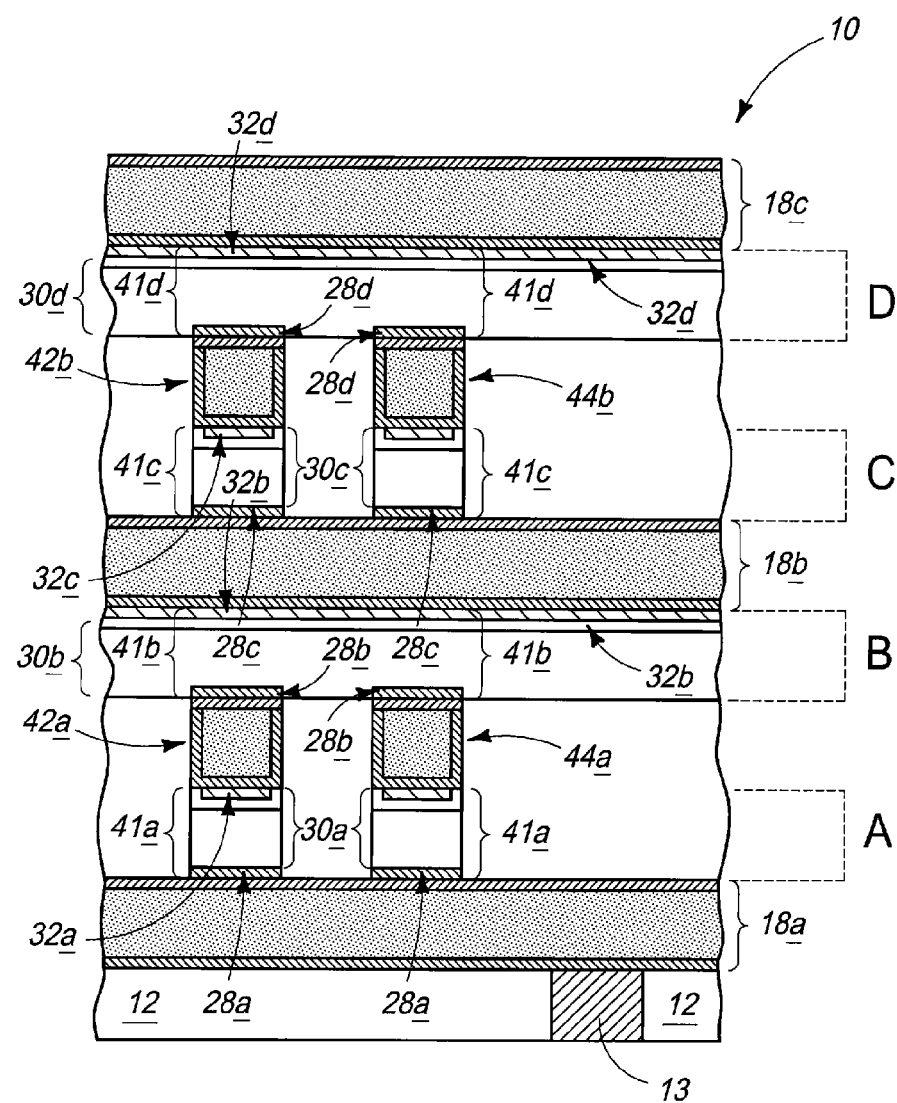

In some embodiments, the processing of FIGS. 1-5 may be considered to form one level of a memory array. Such processing may be repeated to form multiple levels stacked one atop another. Thus, the memory may be vertically stacked. This can advantageously enable highly integrated memory to be achieved utilizing the architecture created through the processing of FIGS. 1-5. FIG. 6 shows construction 10 at a processing stage subsequent to that of FIG. 5, and shows four vertically-stacked levels (A, B, C and D) of a memory array. Each level includes memory cells (41a-d) having a volume of programmable material (30a-d) between a pair of top and bottom electrodes (the bottom electrodes are 28a-d, and the top electrodes are 32a-d). In the shown embodiment, the conductive lines are utilized for programming memory cells above the lines, as well as for programming memory cells below the lines (for instance, line 42a is utilized for programming a memory cell 41a beneath the line as well as for programming a memory cell 41b above the line), and thus the conductive lines are shared between vertically adjacent memory cells.

In some embodiments the configuration of FIG. 6 may be considered to comprise a memory array having vertically-stacked levels of rows and columns. For instance, lines 18a, 18b and 18c may be considered to correspond to three vertically-stacked levels of columns, and lines 42a, 42b, 44a and 44b may be considered to be arranged in two vertically-stacked levels of rows. In the shown embodiment the columns extend along the axis 1, and the rows extend along the axis 2 which is substantially orthogonal to the axis 1.

The embodiments of FIGS. 1-6 have the electrodes and programmable material of the memory cells as the only components provided at the cross-points between the wordlines and bitlines. In some embodiments it may be advantageous to provide select devices adjacent the memory cells at the crosspoints between the wordlines and bitlines.

Figure 7:
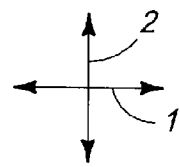
FIG. 7 is a diagrammatic cross-sectional side view of a semiconductor wafer construction at a processing stage alternative to that of FIGS. 5A-5C in accordance with an example embodiment.
Figure 7:
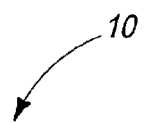
Figure 7:
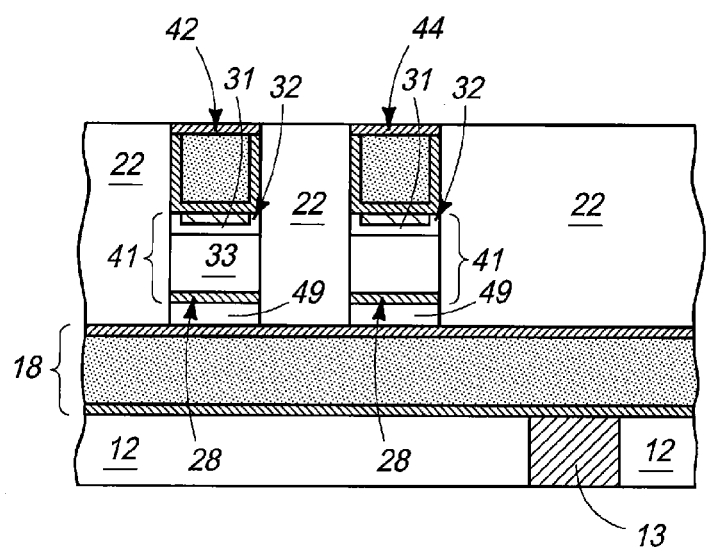
Figure 8A:
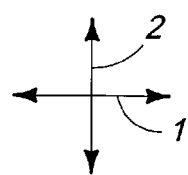
FIG. 8A is a diagrammatic top view of a portion of a semiconductor construction at a process stage of an example embodiment process for forming a memory array.
Figure 8A:
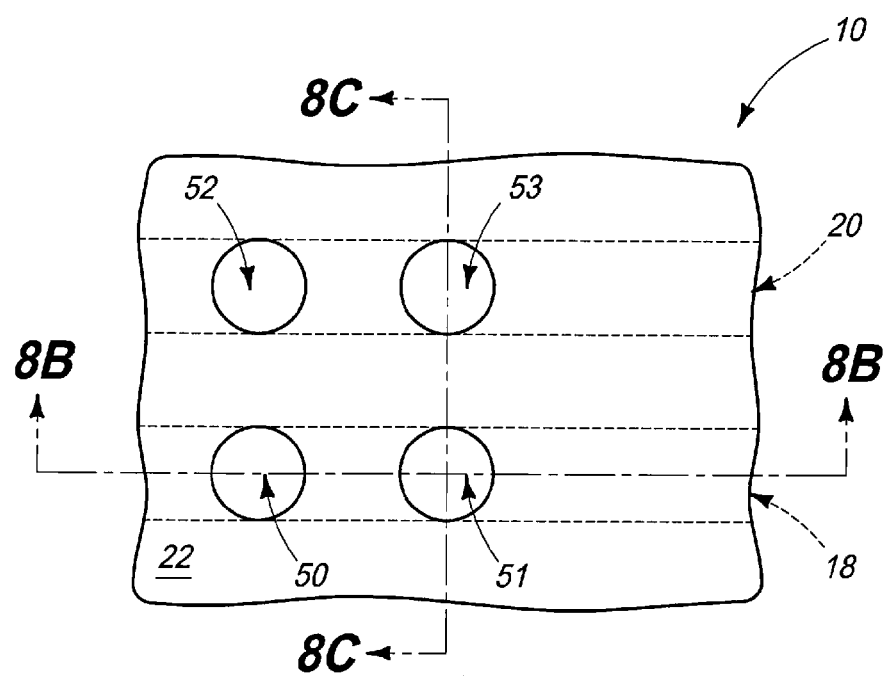
Figure 8B:
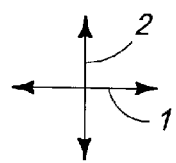
FIGS. 8B and 8C are diagrammatic cross-sectional side views along the lines 8B-8B and 8C-8C, respectively, of FIG. 8A. Also.
Figure 8B:
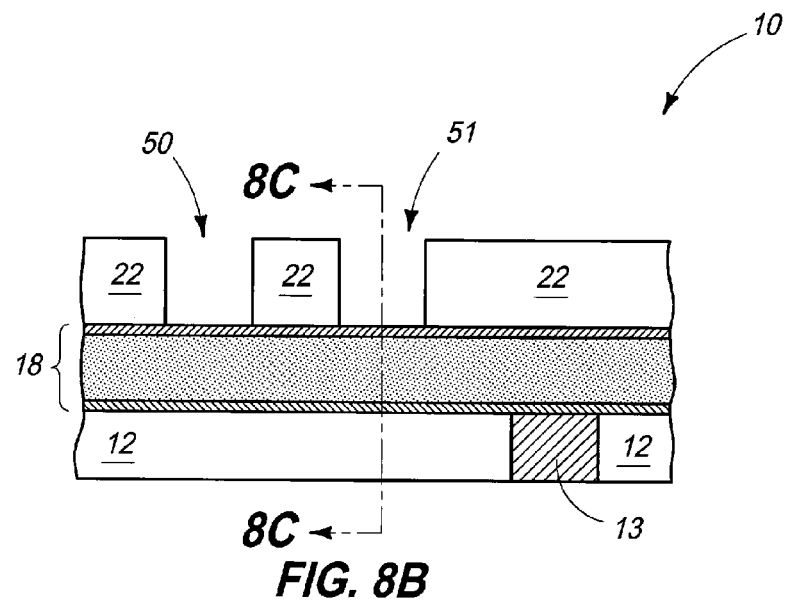
Figure 8C:
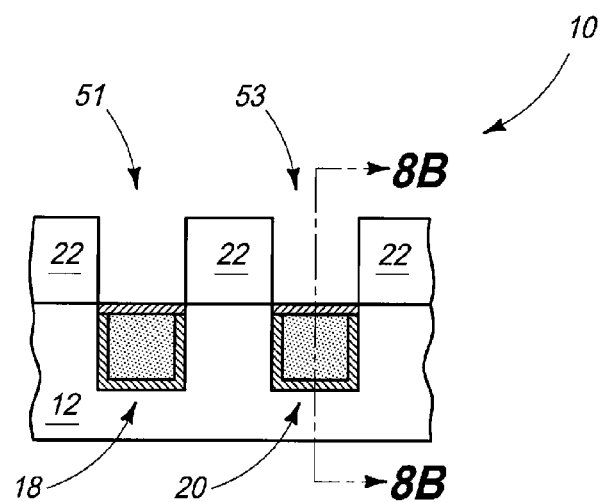
Figure 9A:
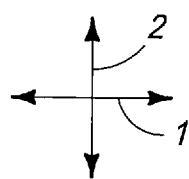
FIG. 9A is a diagrammatic top view of a portion of a semiconductor construction at a process stage subsequent to that of FIG. 8A of an example embodiment process for forming a memory array.
Figure 9A:
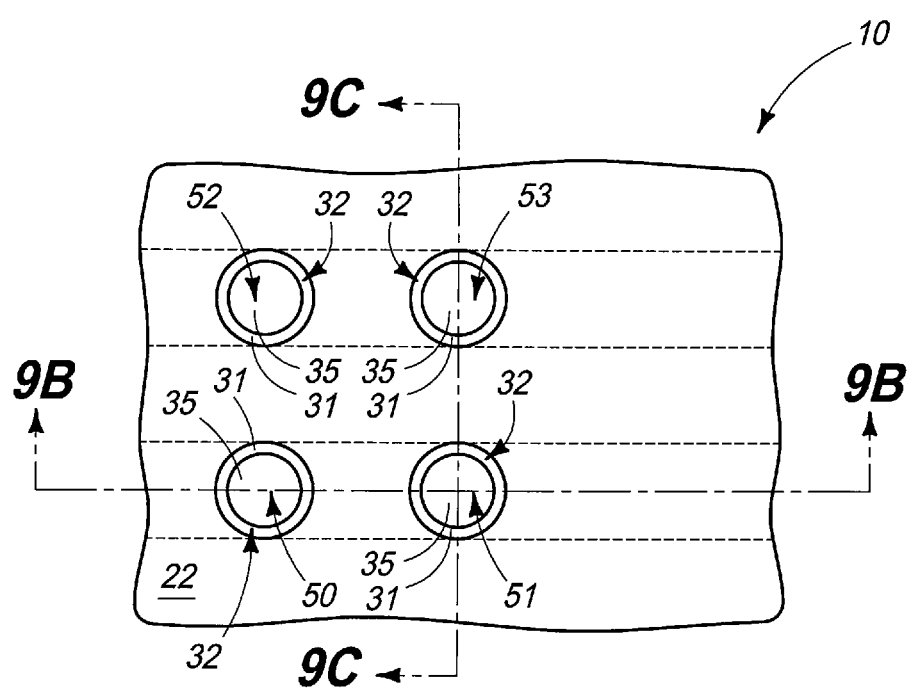
Figure 9B:
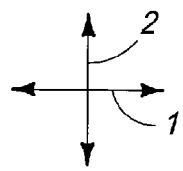
FIGS. 9B and 9C are diagrammatic cross-sectional side views along the lines 9B-9B and 9C-9C, respectively, of FIG. 9A. Also.
Figure 9B:
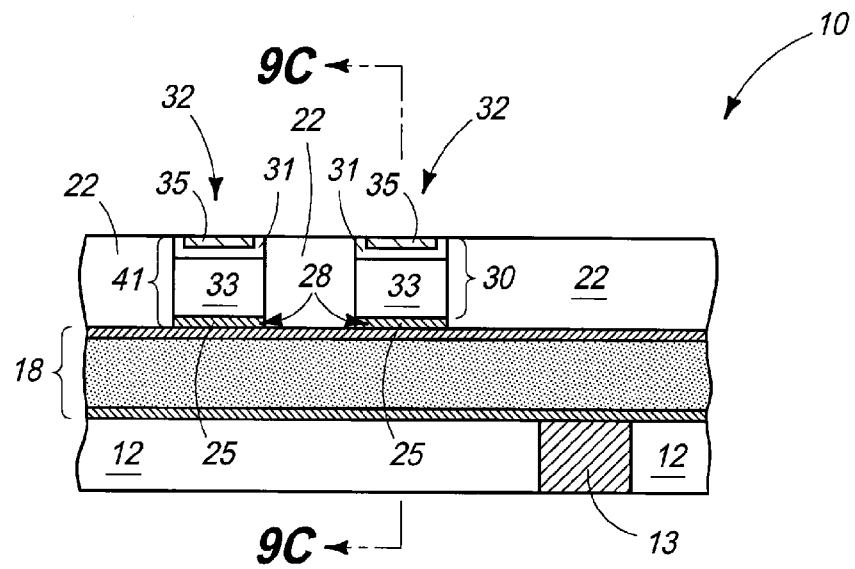
Figure 9C:
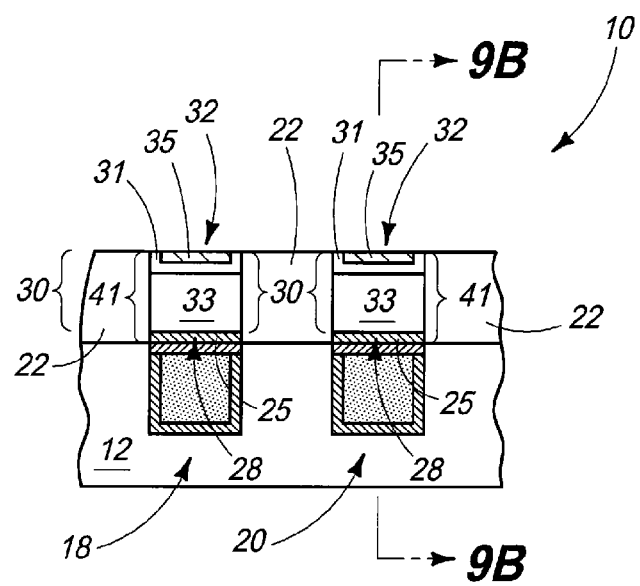
Figure 10A:
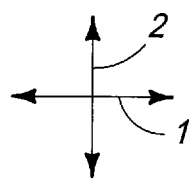
FIG. 10A is a diagrammatic top view of a portion of a semiconductor construction at a process stage subsequent to that of FIG. 9A of an example embodiment process for forming a memory array.
Figure 10A:
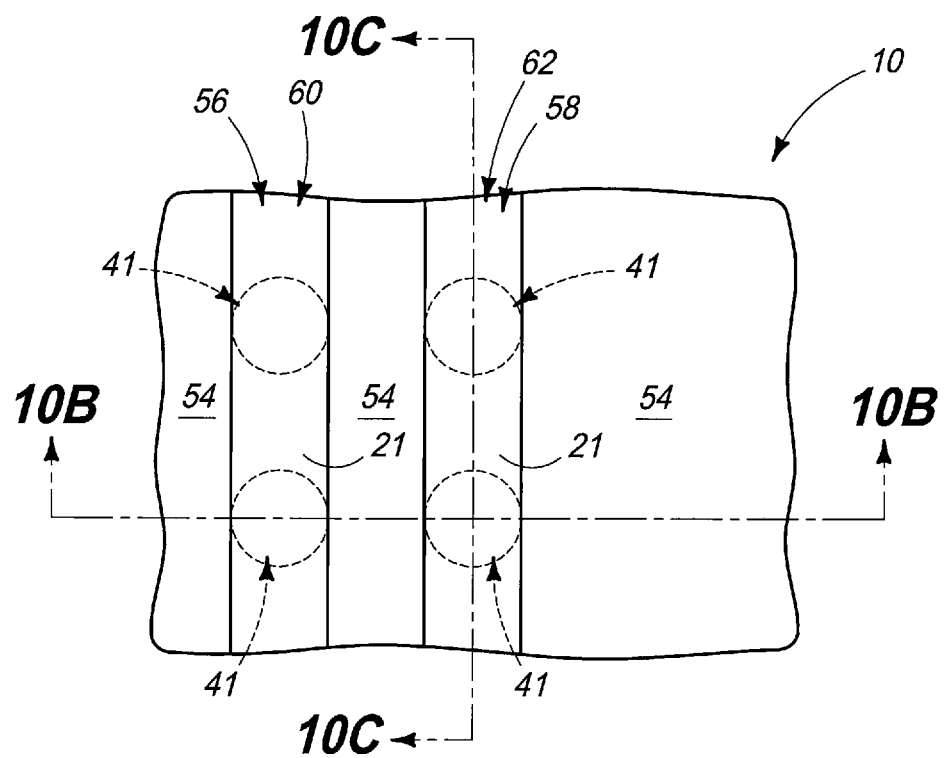
Figure 10B:
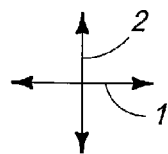
FIGS. 10B and 10C are diagrammatic cross-sectional side views along the lines 10B-10B and 10C-10C, respectively, of FIG. 10A. Also.
Figure 10B:
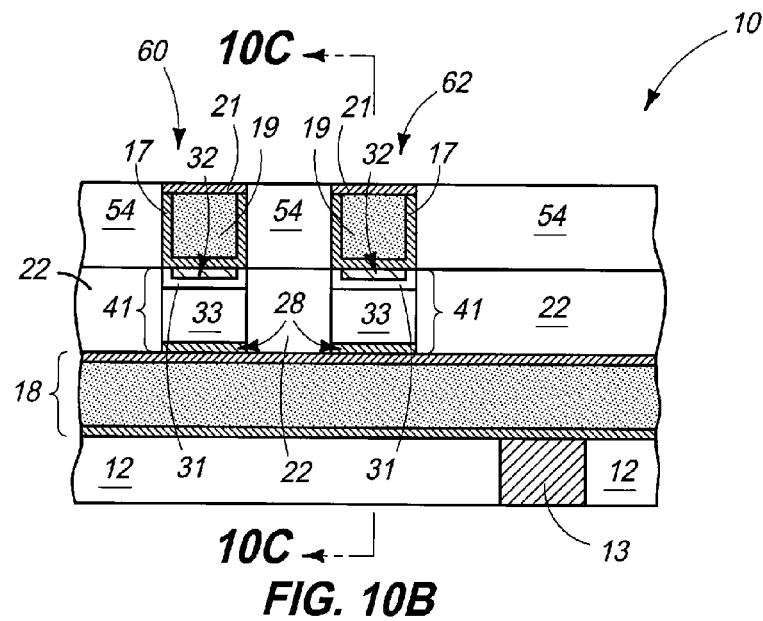
Figure 10C:
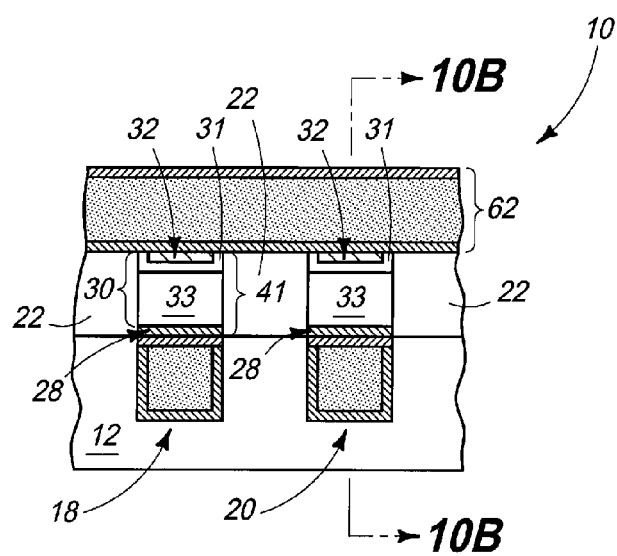

FIG. 7 illustrates an example construction in which select devices 49 are provided between the bottom electrodes 28 and the conductive line 18. Identical numbering is utilized in the embodiment of FIG. 7 as is used in FIGS. 1-6. The only difference between the embodiment of FIG. 7 and the embodiments of FIGS. 1-6 is the inclusion of the select devices 49 in the embodiment of FIG. 7.

Select devices 49 may comprise any suitable configurations, and in some embodiments may be Schottky diodes. Example Schottky diodes may be formed by providing silicon between conductive line 18 and platinum electrodes 28. Provision of such silicon can lead to platinum silicide formation adjacent bottom electrodes 28, and such platinum silicide can function together with materials adjacent thereto as a Schottky diode.

Another embodiment is described with reference to FIGS. 8-10. Identical numbering will be used to describe FIGS. 8-10 as is used above in describing FIGS. 1-7, where appropriate.

FIG. 8 shows construction 10 at a processing stage subsequent to that of FIG. 2, and alternative to that of FIG. 3. Dielectric material 22 is formed over dielectric material 12, and over conductive lines 18 and 20, and is patterned to have a plurality of openings 50-53 provided therein. The openings 50-53 may be formed with photolithographic processing analogous to that described above with reference to FIG. 3 for formation of trenches 24 and 26.

Referring to FIG. 9, memory cells 41 are formed within the openings 50-53. Specifically, first electrode material 25 is deposited at the bottoms of openings 50-53 to form bottom electrodes 28, programmable material 30 is formed within the openings 50-53 over the bottom electrodes, and second electrode material 35 is formed over the programmable material 30 to form top electrodes 32. The programmable material 30 forms pedestals within the openings 50-53.

The bottom electrode material 25, programmable material 30 and second electrode material 35 may be formed within openings 50-53 utilizing any suitable processing. Deposition methods may be utilized, and such deposition methods may be selective, bottom fill or conformal modes. In some embodiments the bottom electrode material may be formed at the bottoms of the openings using one or more of CVD, ALD and PVD; together with appropriate etching and/or masking. Subsequently, materials 31, 33 and 35 may be deposited within the openings 50-53 and across an upper surface of material 22 utilizing one or more ALD, CVD and PVD; and then the materials 31, 33 and 35 may be removed from across the upper surface of material 22 utilizing planarization, such as chemical-mechanical polishing (CMP). Alternatively, the materials 31, 33 and 35 may be patterned to be within the openings 50-53 utilizing a sacrificial mask (not shown) and one or more suitable etches.

In the shown embodiment the high k material 31 has a configuration of an upwardly-opening container, and the second electrode material 35 is contained within such container. Such configuration may be achieved by filling lower portions of openings 50-53 with multivalent metal oxide 33 to leave unfilled upper portions of the openings, lining the upper portions of the openings with high k dielectric material 31, depositing second electrode material 35 within the lined upper portions of the openings, and then conducting appropriate masking, etching and/or polishing to achieve the shown configuration.

The bottom electrodes 28 are shown to be directly over the conductive lines 18 and 20. In other embodiments select devices analogous to the devices 49 of FIG. 7 may be formed between the bottom electrodes and the conductive lines.

Referring to FIG. 10, dielectric material 54 is formed over dielectric material 22 and across the memory cells 41. The dielectric materials 12, 22 and 54 may be referred to as first, second and third dielectric materials, respectively, to distinguish such dielectric materials from one another.

Trenches 56 and 58 are formed through dielectric material 54 to expose upper regions of memory cells 41, and subsequently electrically conductive lines 60 and 62 are formed within such trenches. The electrically conductive lines comprise the materials 17, 19 and 21 discussed above with reference to the lines 18 and 20 of FIG. 2, and may be formed by a damascene process analogous to that discussed above with reference to the fabrication of lines 18 and 20. The memory cells 41 are shown in dashed line in the top view of FIG. 10A to indicate that such memory cells are beneath the lines 60 and 62.

In the embodiment of FIG. 10, the electrically conductive lines 60 and 62 directly contact top electrodes 32 of the memory cells 41, and also directly contact the high k dielectric material 31.

The conductive lines 60 and 62 extend along the axis 2, while the conductive lines 18 and 20 extend along the axis 1. The memory cells 41 are at cross-points where lines 60 and 62 cross lines 18 and 20. The lines 18 and 20 may be considered to be representative of a first series of lines while the lines 60 and 62 are considered to be representative of a second series of lines. Each memory cell is uniquely addressed by the combination of a line from the first series and a line from the second series. The memory cells may thus be configured as a memory array. In some embodiments, memory arrays of the type shown in FIG. 10 may be stacked across numerous vertical levels analogously to the stacking described above with reference to FIG. 6.

Another embodiment is described with reference to FIGS. 11-15. Identical numbering will be used to describe FIGS. 11-15 as is used above in describing FIGS. 1-10, where appropriate.

FIG. 11 shows construction 10 at a processing stage analogous to that of FIG. 8. Openings 50-53 have been formed in dielectric material 22. Conductive material pillars 70-73 are formed within the openings 50-53, respectively. The pillars comprise bottom electrode material 25 over conductive material 74.

The conductive material 74 may comprise any suitable composition or combination of compositions, and in some embodiments may comprise metal (for instance, tungsten, titanium, etc.), metal-containing substances (for instance, metal nitrides, metal silicides, etc.) and/or conductively-doped semiconductor materials (for instance, conductively-doped silicon, conductively-doped germanium, etc.). Although material 74 is shown to be homogeneous, in other embodiments the conductive material may comprise multiple discrete layers.

Figure 11A:
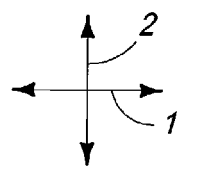
FIG. 11A is a diagrammatic top view of a portion of a semiconductor construction at a process stage of an example embodiment process for forming a memory array.
Figure 11A:
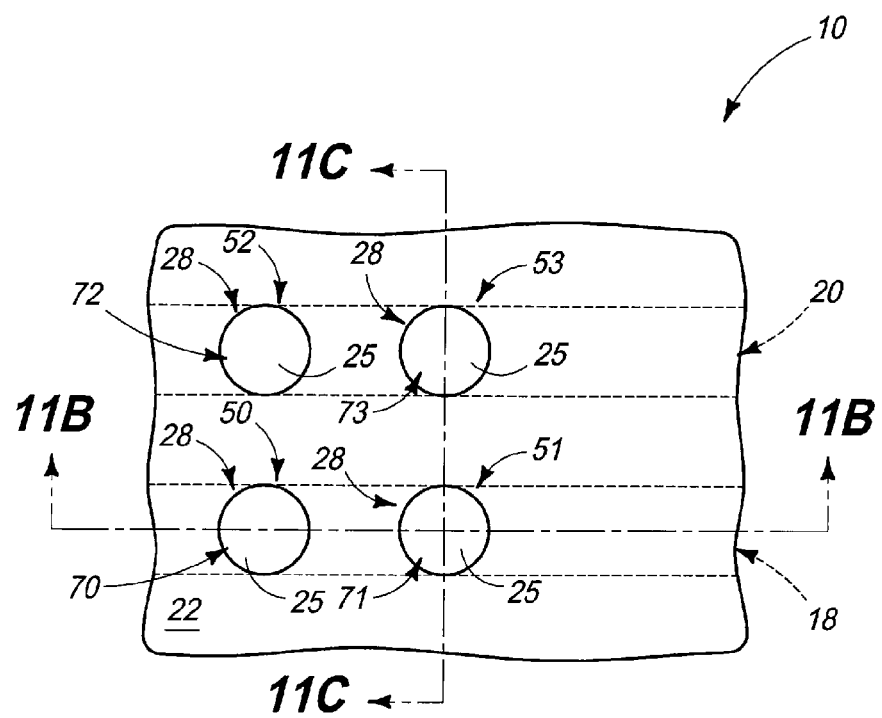
Figure 11B:
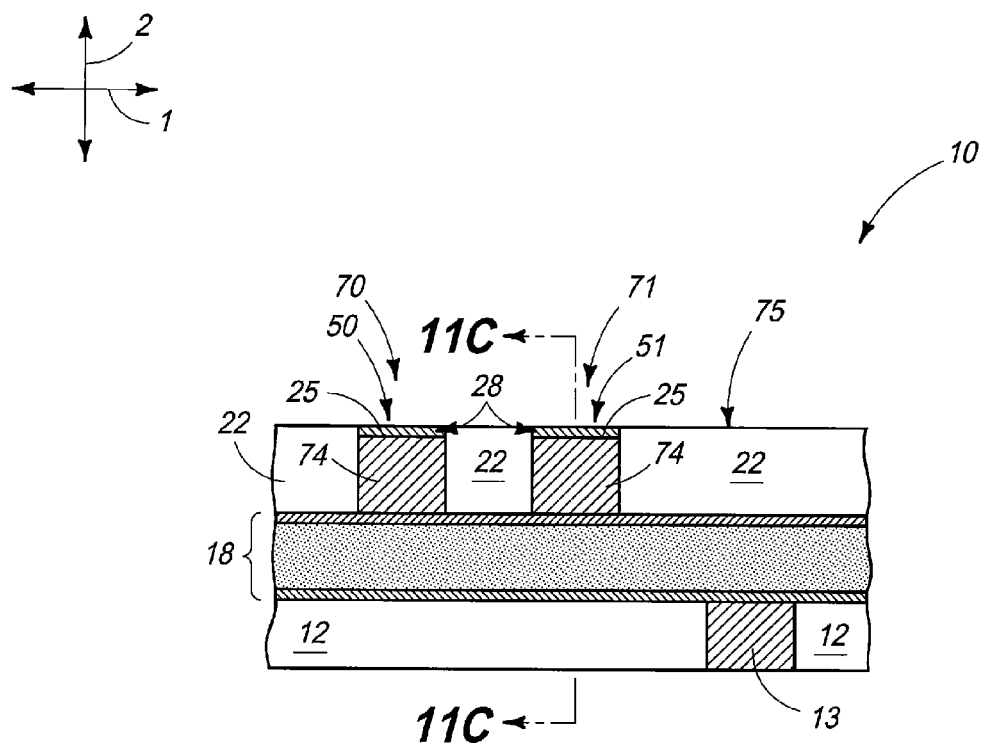
FIGS. 11B and 11C are diagrammatic cross-sectional side views along the lines 11B-11B and 11C-11C, respectively, of FIG. 11A. Also.
Figure 11C:
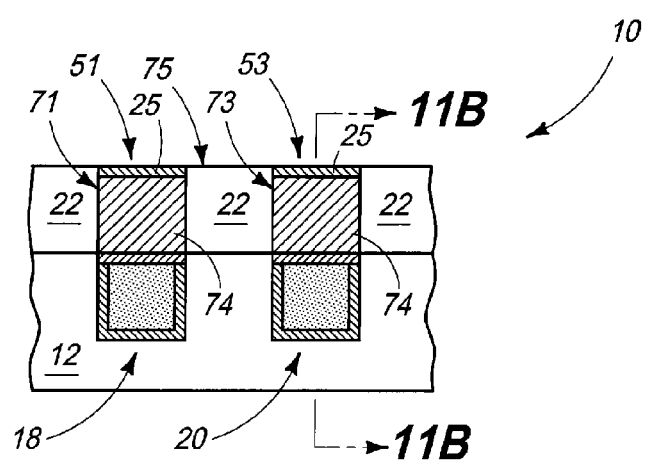
Figure 12A:
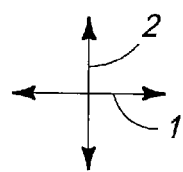
FIG. 12A is a diagrammatic top view of a portion of a semiconductor construction at a process stage subsequent to that of FIG. 11A of an example embodiment process for forming a memory array.
Figure 12A:
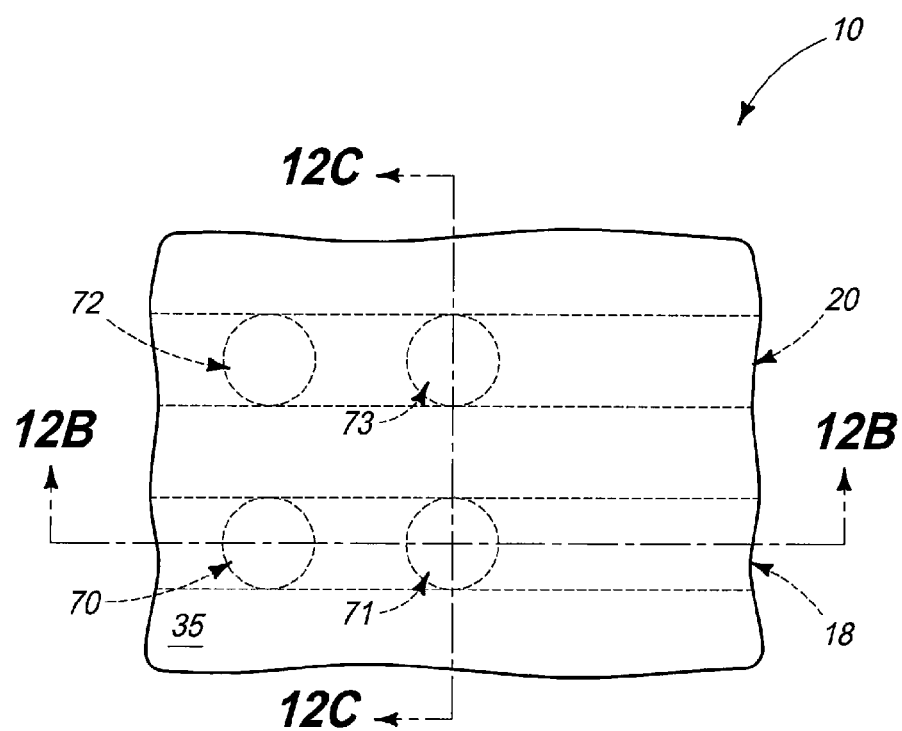
Figure 12B:
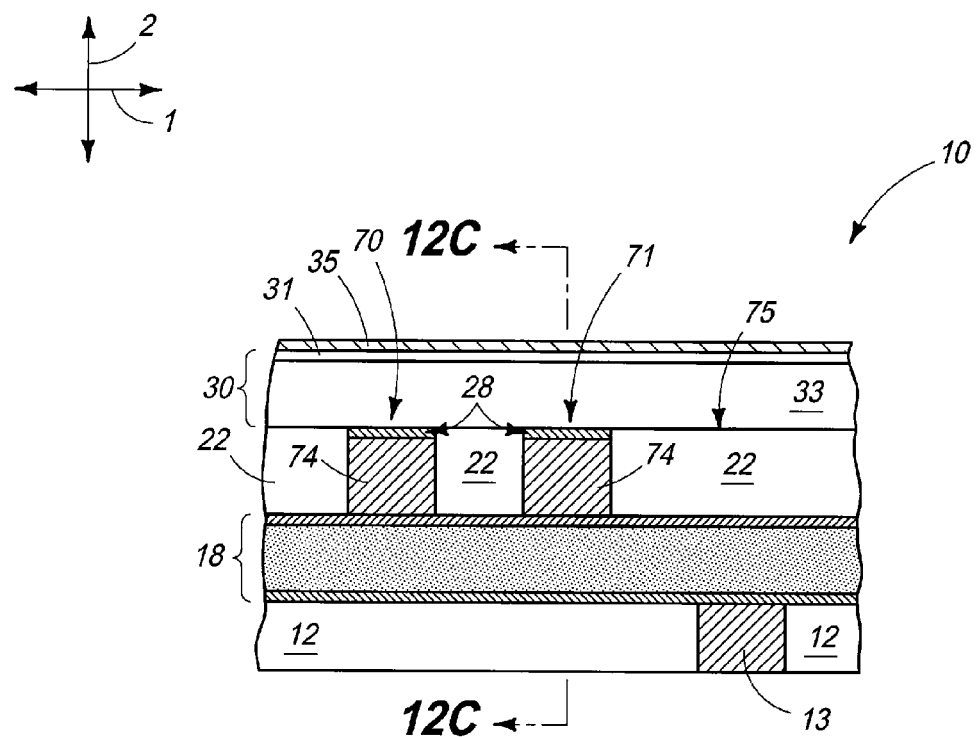
FIGS. 12B and 12C are diagrammatic cross-sectional side views along the lines 12B-12B and 12C-12C, respectively, of FIG. 12A. Also.
Figure 12C:
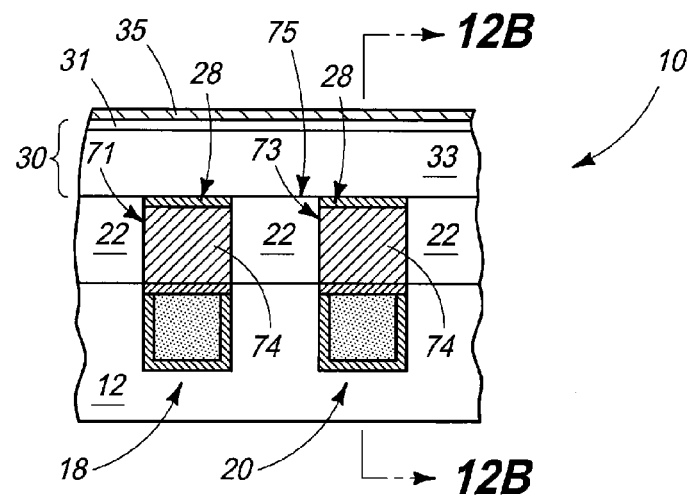
Figure 13A:
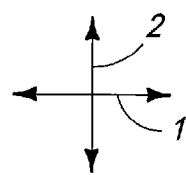
FIG. 13A is a diagrammatic top view of a portion of a semiconductor construction at a process stage subsequent to that of FIG. 12A of an example embodiment process for forming a memory array.
Figure 13A:
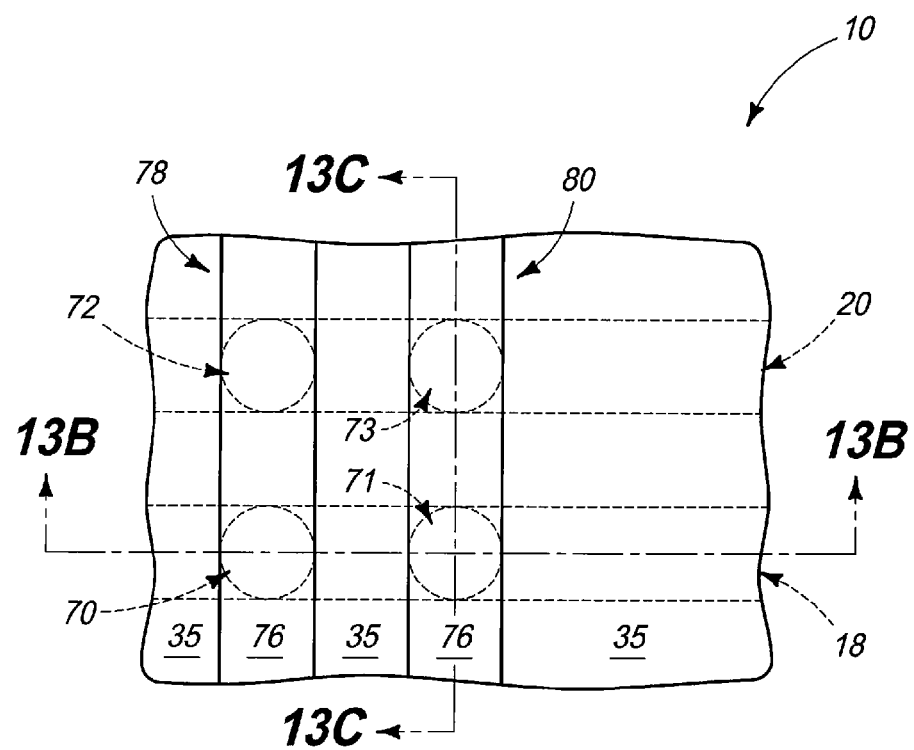
Figure 13B:
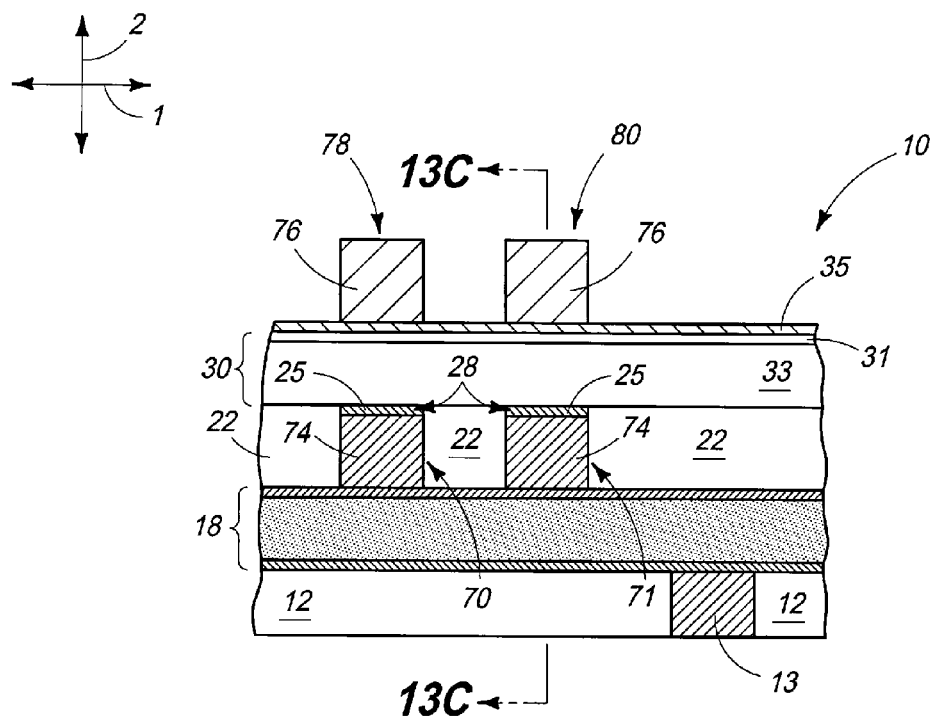
FIGS. 13B and 13C are diagrammatic cross-sectional side views along the lines 13B-13B and 13C-13C, respectively, of FIG. 13A. Also.
Figure 13C:
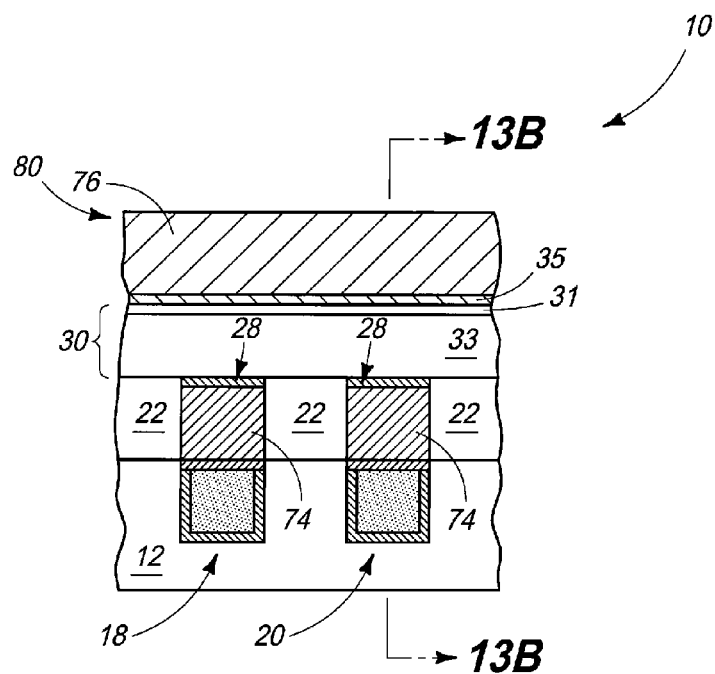
Figure 14A:
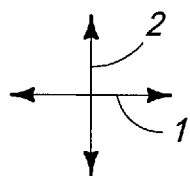
FIG. 14A is a diagrammatic top view of a portion of a semiconductor construction at a process stage subsequent to that of FIG. 13A of an example embodiment process for forming a memory array.
Figure 14A:
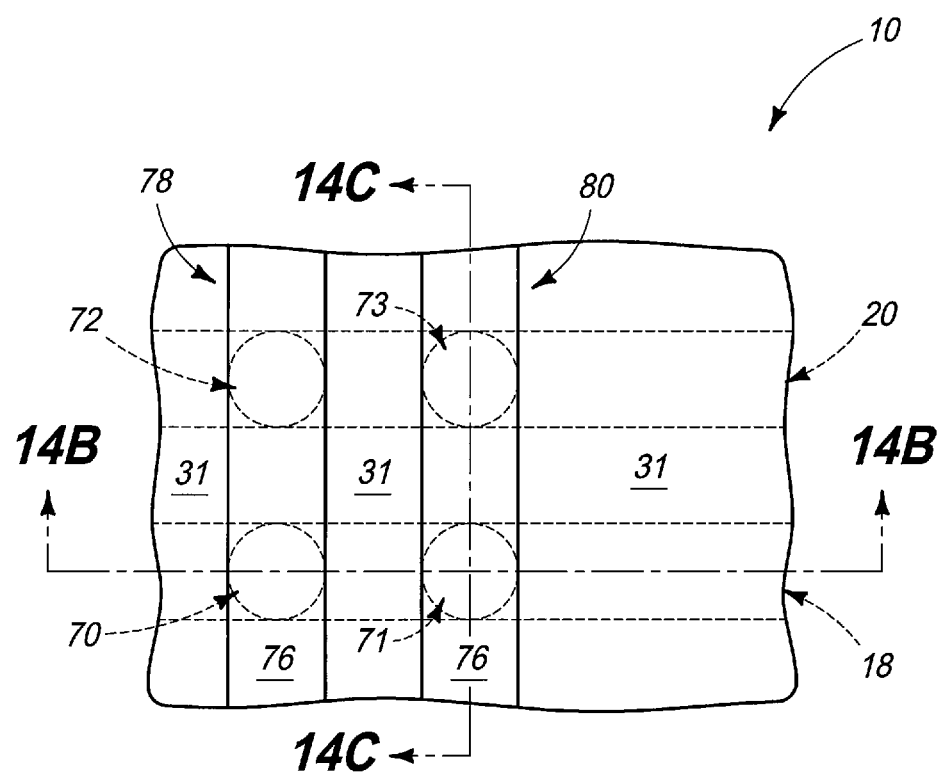
Figure 14B:
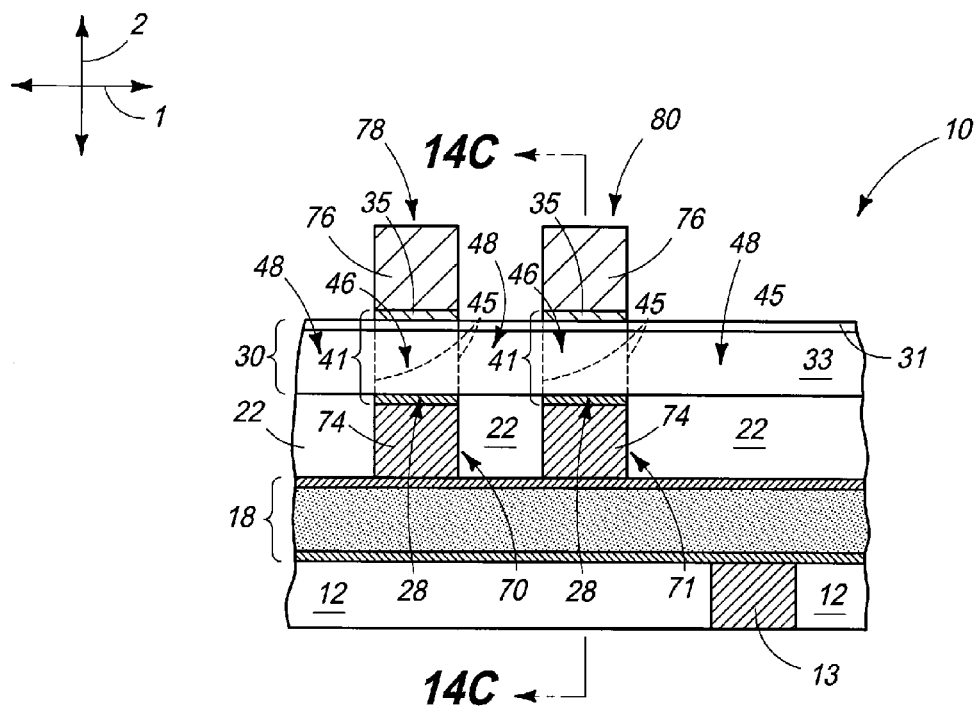
FIGS. 14B and 14C are diagrammatic cross-sectional side views along the lines 14B-14B and 14C-14C, respectively, of FIG. 14A. Also.
Figure 14C:
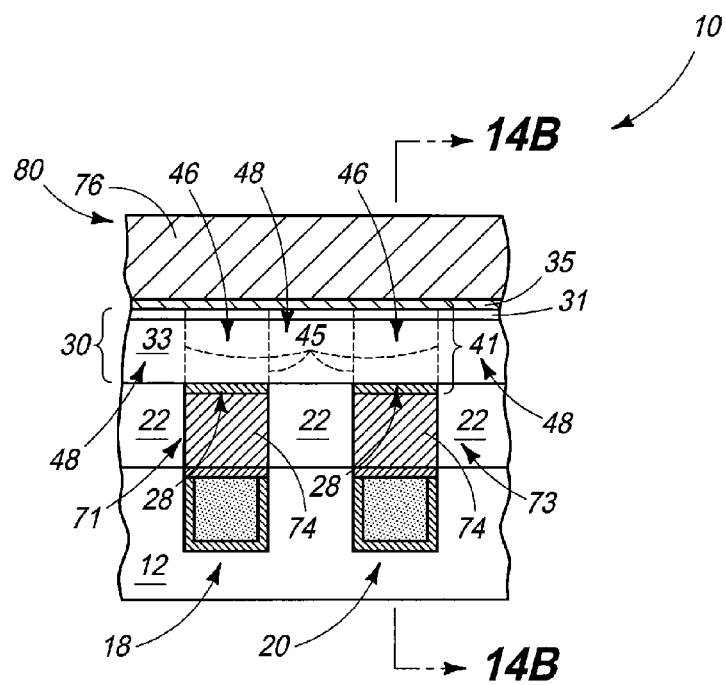
Figure 15A:
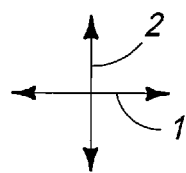
FIG. 15A is a diagrammatic top view of a portion of a semiconductor construction at a process stage subsequent to that of FIG. 14A of an example embodiment process for forming a memory array.
Figure 15A:
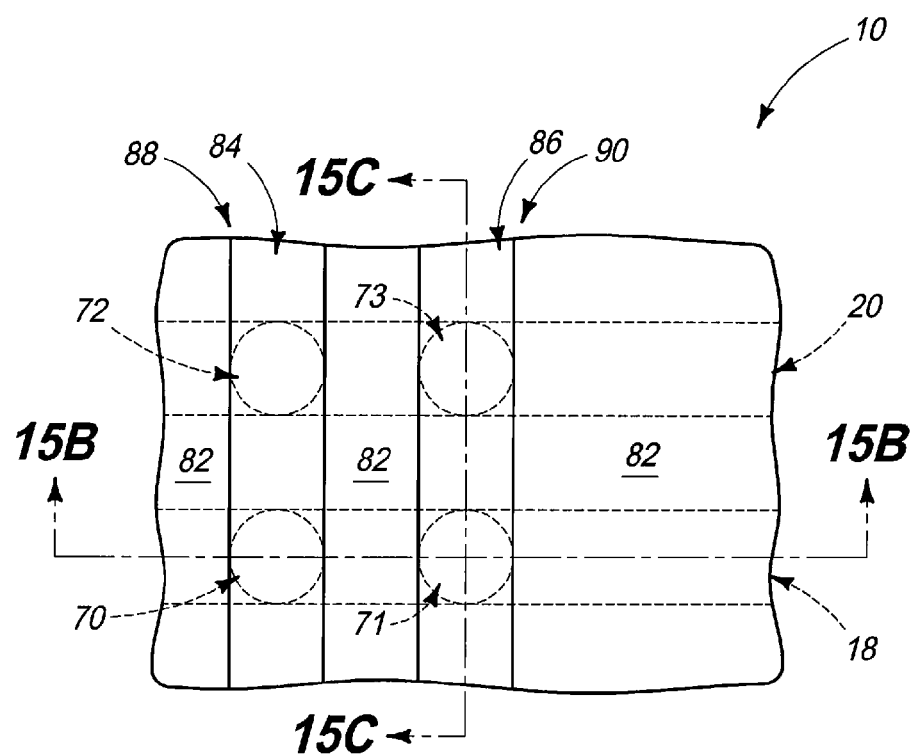
Figure 15B:
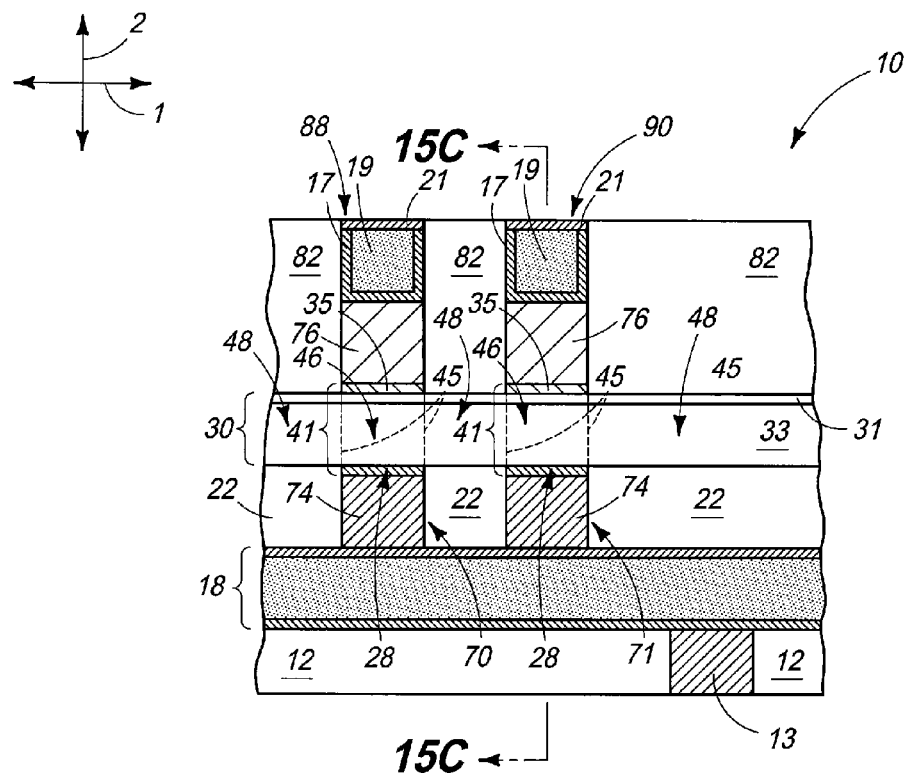
FIGS. 15B and 15C are diagrammatic cross-sectional side views along the lines 15B-15B and 15C-15C, respectively, of FIG. 15A. Also.
Figure 15C:
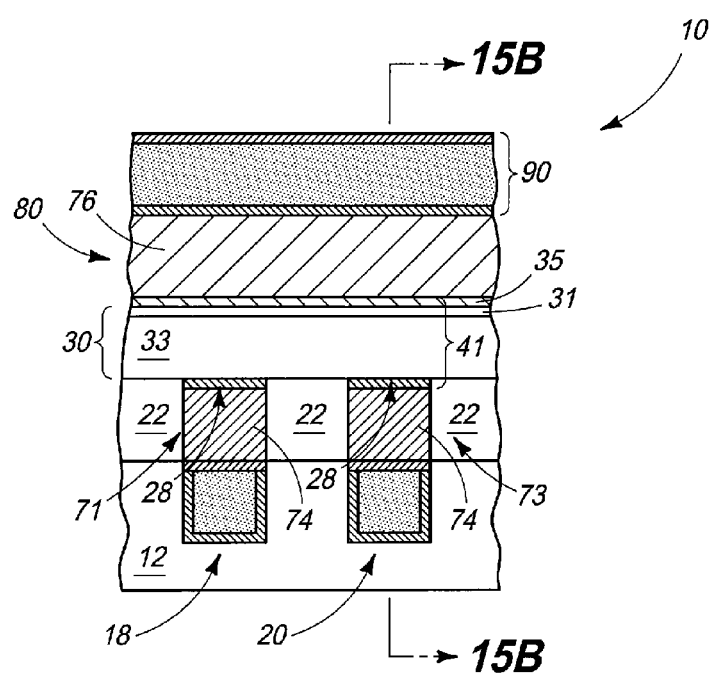
Figure 16A:
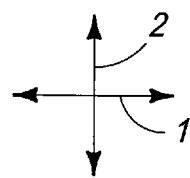
FIG. 16A is a diagrammatic top view of a portion of a semiconductor construction at a process stage of an example embodiment process for forming a memory array.
Figure 16A:
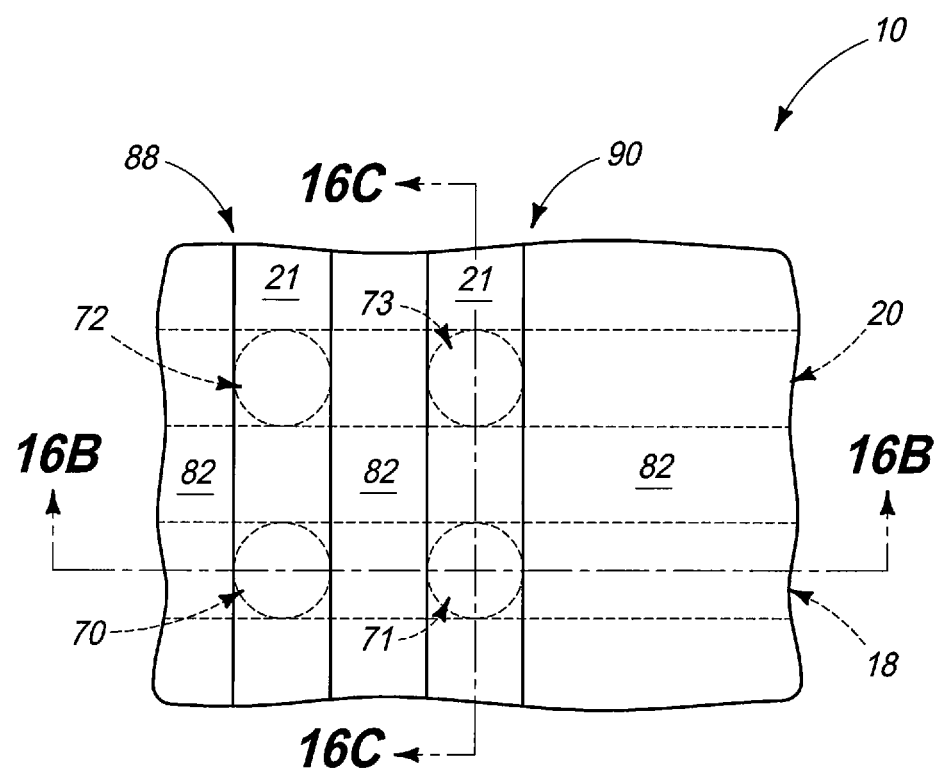
Figure 16B:
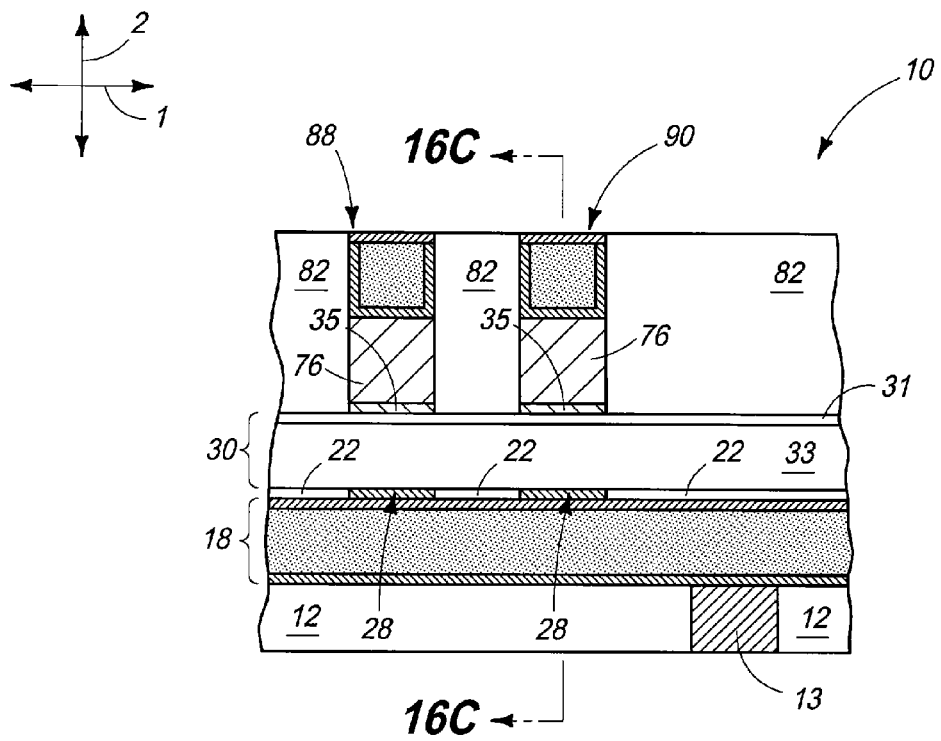
FIGS. 16B and 16C are diagrammatic cross-sectional side views along the lines 16B-16B and 16C-16C, respectively, of FIG. 16A. Also.
Figure 16C:
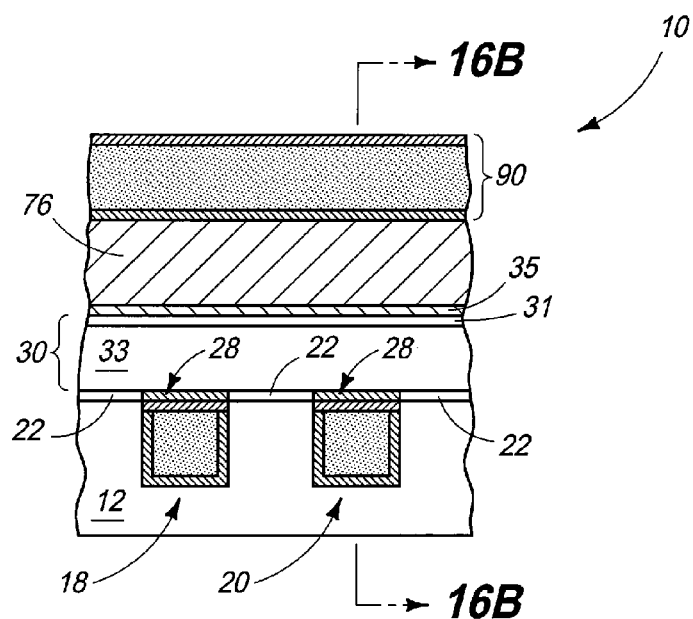
Figure 17A:
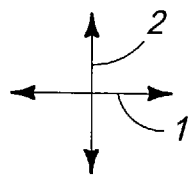
FIG. 17A is a diagrammatic top view of a portion of a semiconductor construction at a process stage of an example embodiment process for forming a memory array.
Figure 17A:
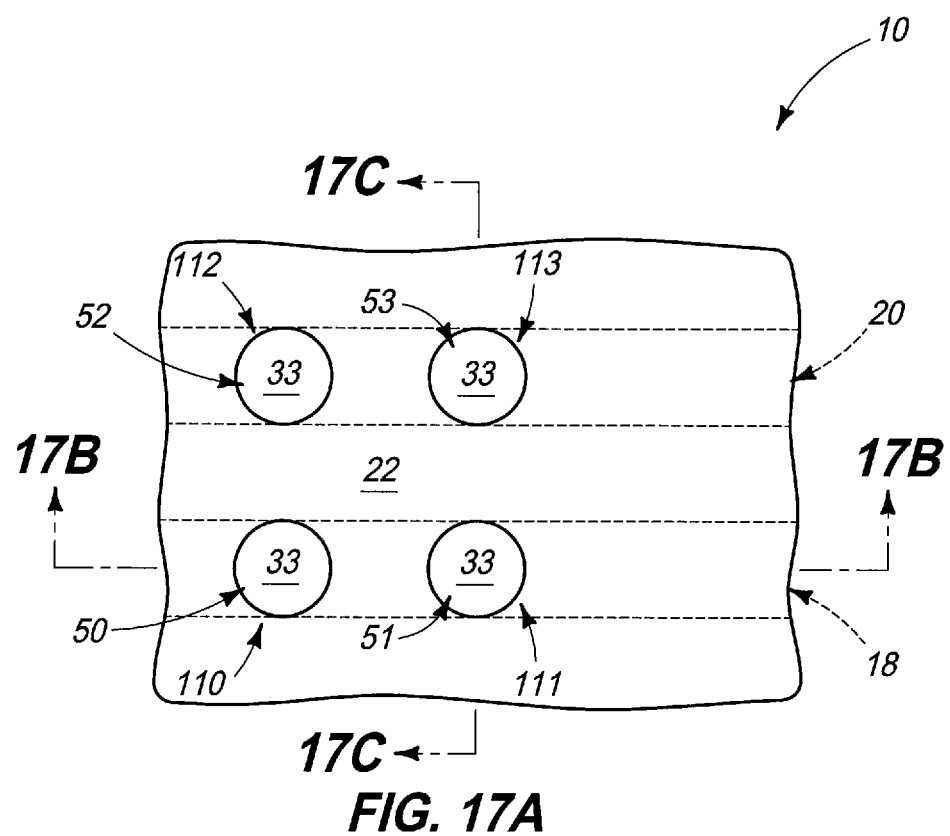
Figure 17B:
FIGS. 17B and 17C are diagrammatic cross-sectional side views along the lines 17B-17B and 17C-17C, respectively, of FIG. 17A. Also.
Figure 17B:
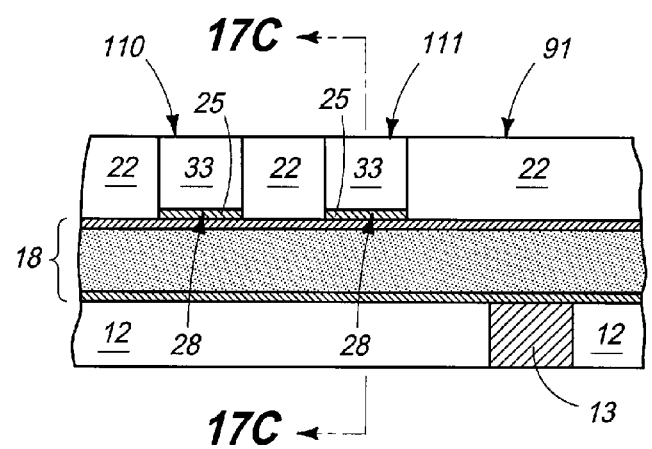
Figure 17C:
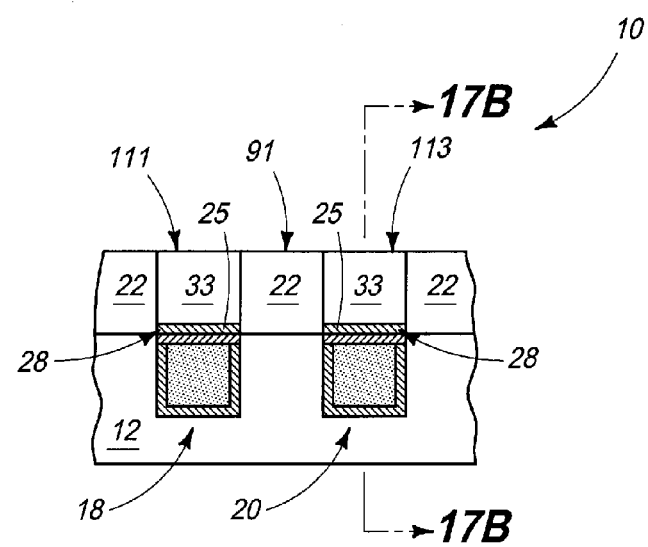
Figure 18A:
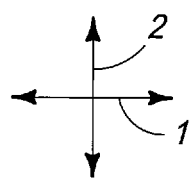
FIG. 18A is a diagrammatic top view of a portion of a semiconductor construction at a process stage subsequent to that of FIG. 17A of an example embodiment process for forming a memory array.
Figure 18A:
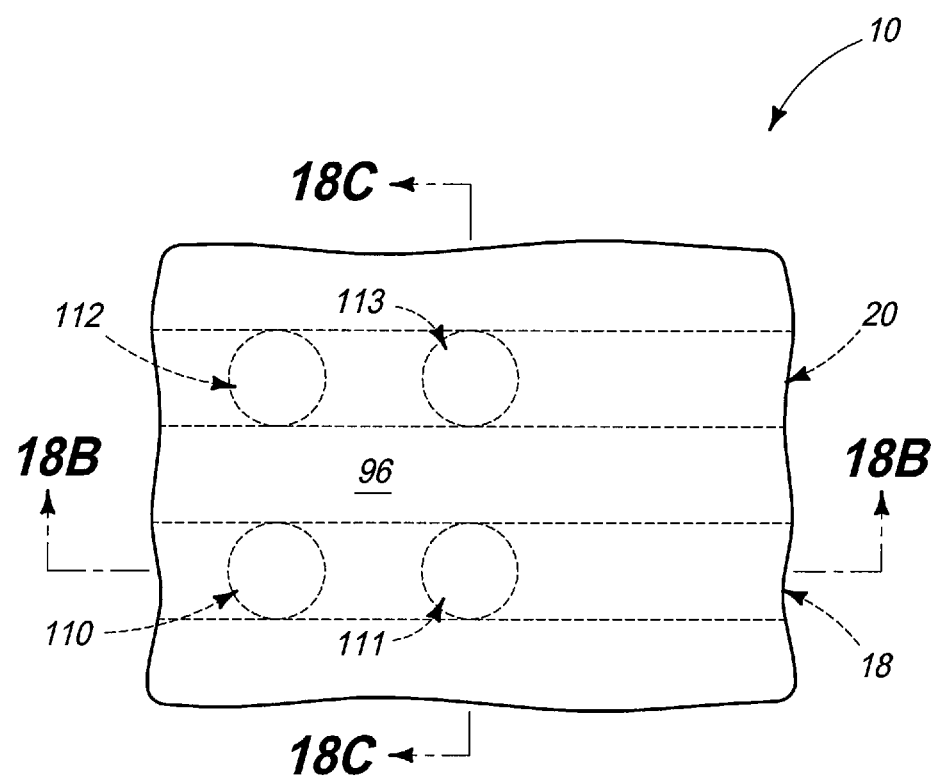
Figure 18B:
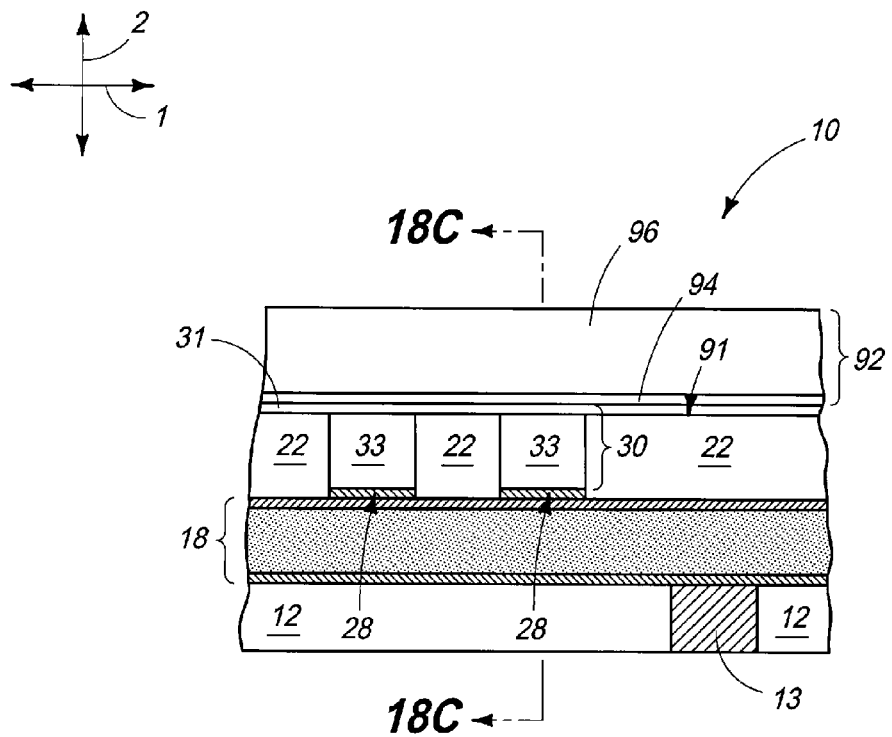
FIGS. 18B and 18C are diagrammatic cross-sectional side views along the lines 18B-18B and 18C-18C, respectively, of FIG. 18A. Also.
Figure 18C:
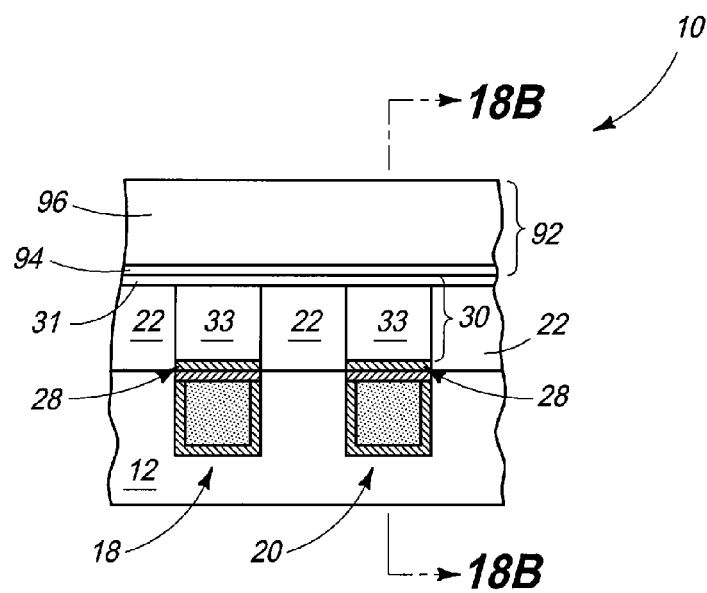
Figure 19A:
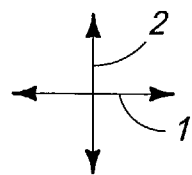
FIG. 19A is a diagrammatic top view of a portion of a semiconductor construction at a process stage subsequent to that of FIG. 18A of an example embodiment process for forming a memory array.
Figure 19A:
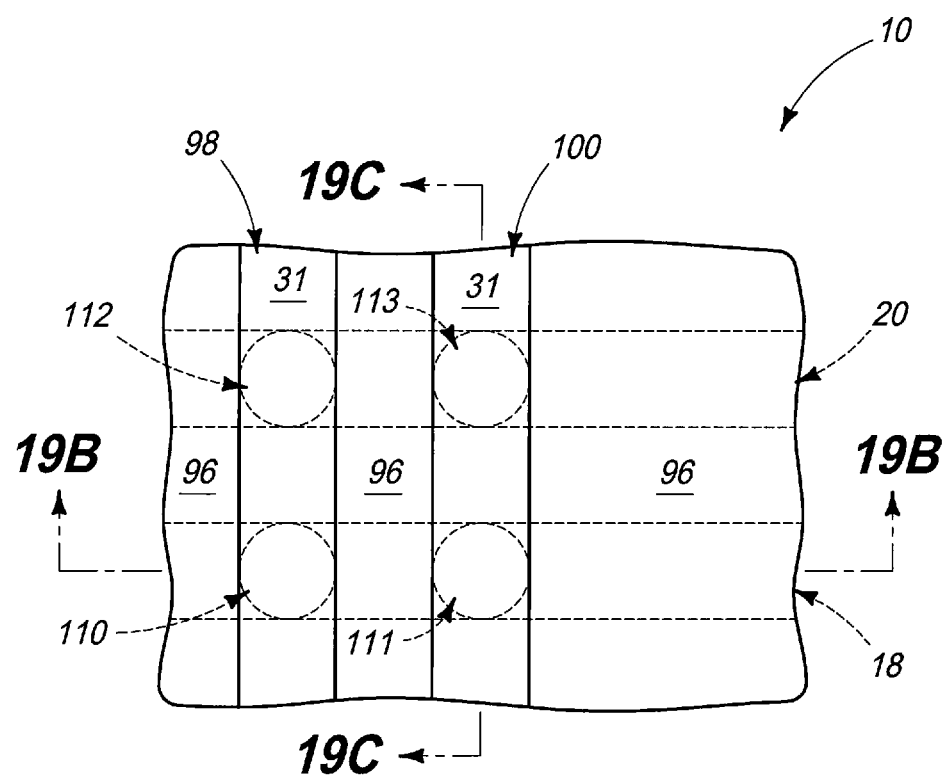
Figure 19B:
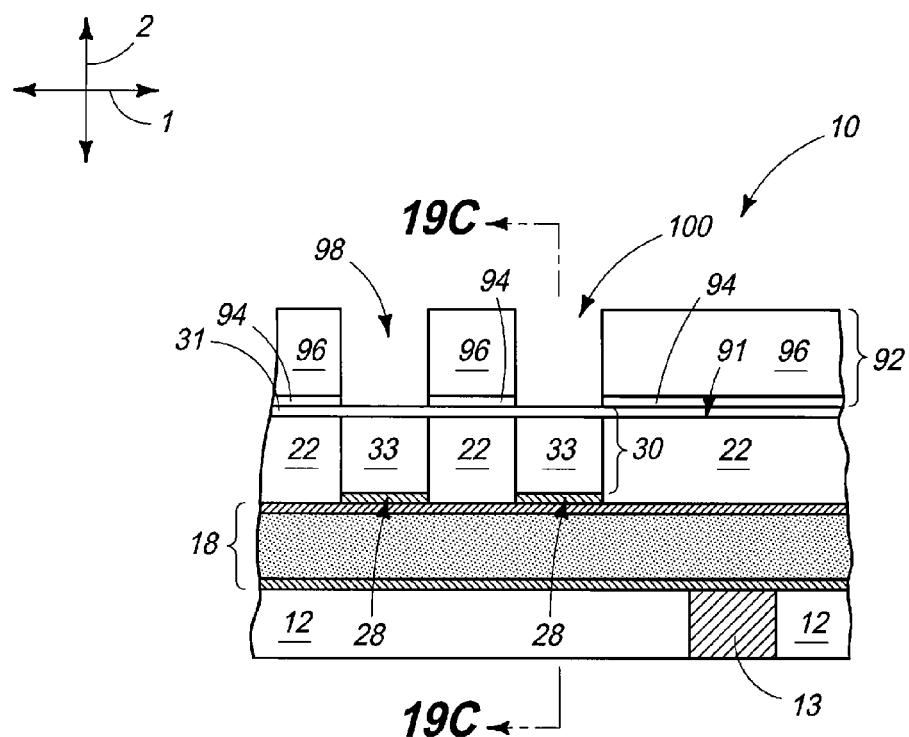
FIGS. 19B and 19C are diagrammatic cross-sectional side views along the lines 19B-19B and 19C-19C, respectively, of FIG. 19A. Also.
Figure 19C:
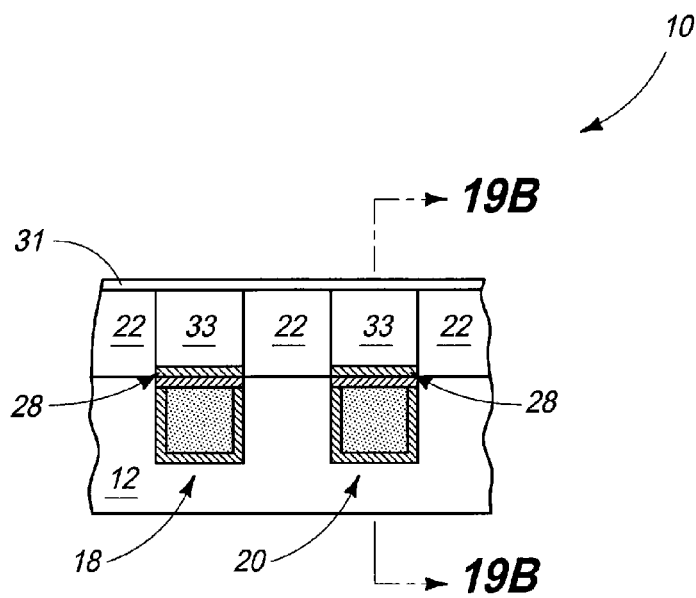
Figure 20A:
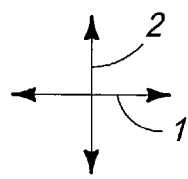
FIG. 20A is a diagrammatic top view of a portion of a semiconductor construction at a process stage subsequent to that of FIG. 19A of an example embodiment process for forming a memory array.
Figure 20A:
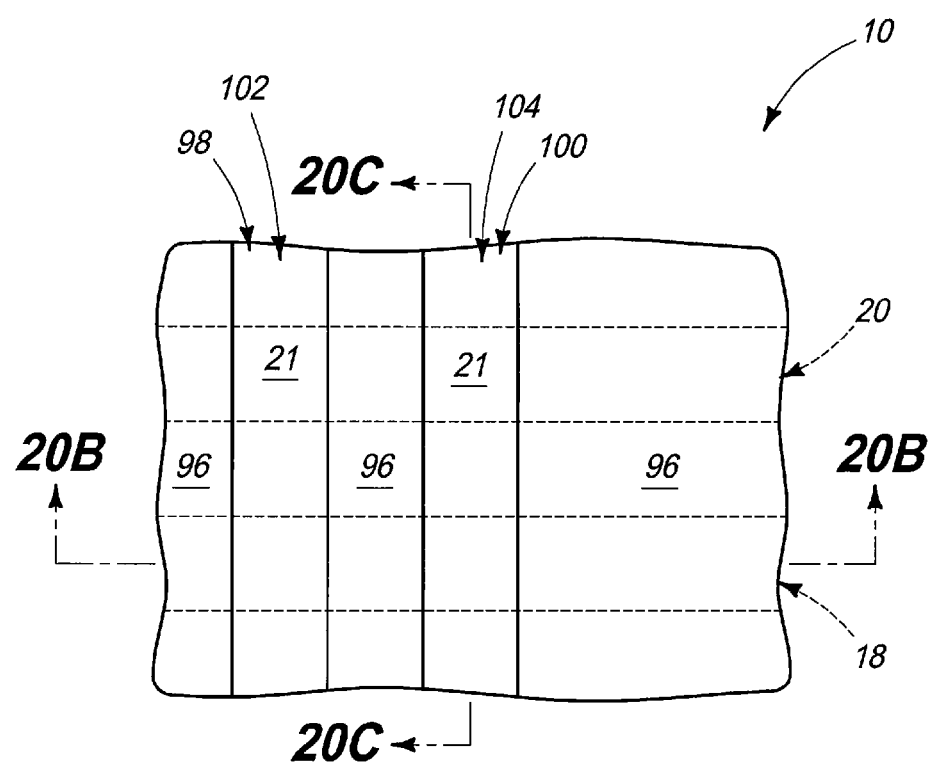
Figure 20B:
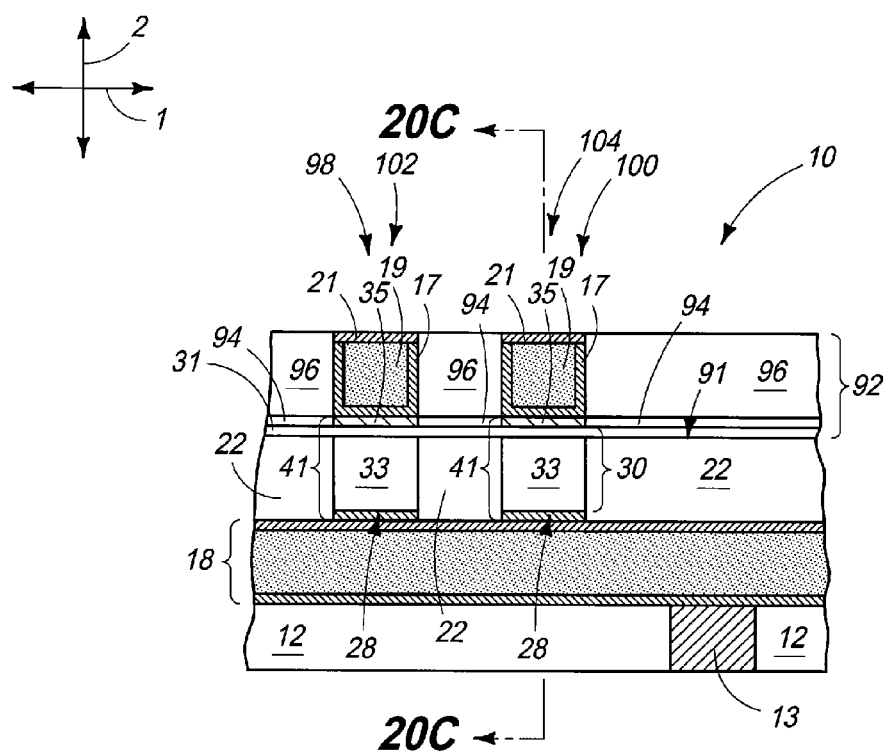
FIGS. 20B and 20C are diagrammatic cross-sectional side views along the lines 20B-20B and 20C-20C, respectively, of FIG. 20A. Also.
Figure 20C:
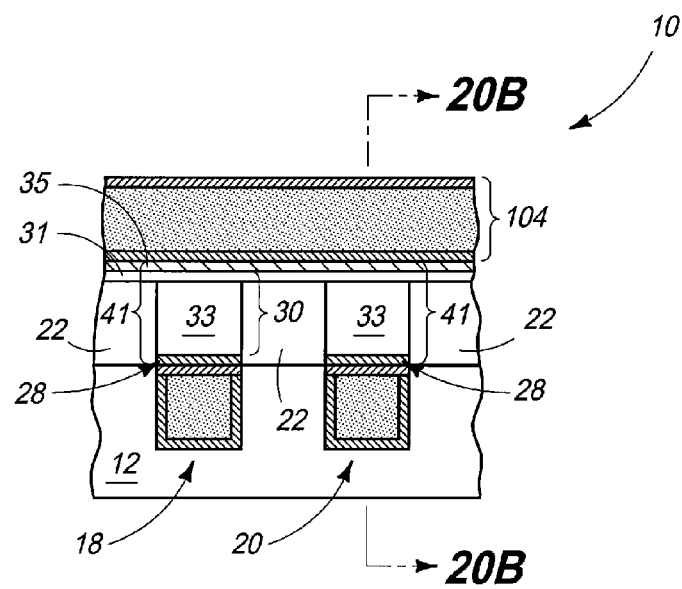

The electrode material 25 forms bottom electrodes 28 within openings 50-53, with such bottom electrodes being caps at the tops of the pillars 70-73. The top view of FIG. 11A shows that multiple pillars are associated with each of the conductive lines 18 and 20, or in other words that the pillars are in a many-to-one relationship relative to each of the conductive lines. The formation of the bottom electrodes 28 within openings 50-53 thus enables multiple spaced-apart electrodes to be formed across each of the conductive lines 18 and 20.

The construction of FIG. 11 may be fabricated by any suitable method. For instance, conductive material 74 may be initially deposited within openings 50-53 to partially fill such openings, and subsequently electrode material 25 may be deposited within the partially filled openings to overfill the openings. Subsequently, CMP may be utilized to remove excess material 25 from over dielectric material 22. The CMP may form the shown substantially planar upper surface 75 extending across pillars 70-73, and across dielectric material 22.

Referring to FIG. 12, an expanse of programmable material 30 is formed across surface 75, and an expanse of top electrode material 35 is formed over the programmable material. The expanses of programmable material 30 and top electrode material 35 extend entirely across the upper surface of construction 10, and thus extend across all of the pillars 70-73.

In the shown embodiment the programmable material 30 is formed conformally over the substantially planar upper surface 75, and thus the programmable material forms a substantially planar expanse across surface 75. Similarly, top electrode material 35 forms a substantially planar expanse across programmable material 30.

Referring to FIG. 13, electrically conductive hard mask material 76 is formed over top electrode material 35. In the shown embodiment the hard mask material has been patterned into a pair of lines 78 and 80 that extend along the second axis 2, and thus orthogonally to the lines 18 and 20. The hard mask material may be deposited and patterned utilizing any suitable methodology. For instance, an expanse of the hard mask material may be deposited across an upper surface of top electrode material 35 utilizing one or more of ALD, CVD and PVD, and subsequently such expanse may be patterned utilizing a photolithographically-formed photoresist mask (not shown) and one or more suitable etches. The hard mask material 75 may comprise any suitable composition or combination of compositions; and in some embodiments may comprise, consist essentially of, or consist of one or more of carbon, various metals, metal-containing compositions, and conductively-doped semiconductor materials. In some embodiments the material 75 may comprise, consist essentially of, or consist of tungsten.

Referring to FIG. 14, a pattern of the patterned hardmask material 76 is transferred into underlying top electrode material 35 with one or more suitable etches. Such patterns the top electrode material into lines extending across pillars 70-73, and orthogonally relative to lines 18 and 20.

Memory cells 41 are defined at locations where the upper electrode material 35 crosses bottom electrodes 28. The regions of programmable material 30 that are within such memory cells (i.e., the regions of material 30 that are directly between top electrode material 35 and the bottom electrodes 28) corresponds to cell regions 46, while regions of material 30 that are not directly between the top electrode material and the bottom electrodes are intervening regions. Dashed lines 45 are provided to diagrammatically illustrate boundaries between the cell regions and the intervening regions.

If programmable material 30 comprises phase change materials, it may be advantageous to amorphize the programmable material within intervening regions 48 to reduce or eliminate cross-talk between adjacent memory cells. Such amorphization may be conducted with methodology analogous to that discussed above with reference to FIG. 5.

Referring to FIG. 15, dielectric material 82 is formed over programmable material 30 and lines 78 and 80. The dielectric materials 12, 22 and 82 may be referred to as first, second and third dielectric materials, respectively, to distinguish such dielectric materials from one another.

Dielectric material 82 may comprise any suitable composition or combination of compositions. Although material 82 is shown to be a single homogeneous layer, in some embodiments material 82 may comprise multiple discrete layers. For instance, a thin dielectric layer may be formed over the upper surface of programmable material 30, and then a thicker dielectric layer may be formed over the thin layer to create a dielectric mass having the shown thickness of material 82.

Trenches 84 and 86 are formed through dielectric material 84 to expose upper surfaces of lines 78 and 80, and subsequently electrically conductive lines 88 and 90 are formed within such trenches. The electrically conductive lines comprise the materials 17, 19 and 21 discussed above with reference to the lines 18 and 20 of FIG. 2, and may be formed by a damascene process analogous to that discussed above with reference to the fabrication of lines 18 and 20.

In some embodiments the lines 18 and 20 may be considered representative of a first series of lines while the lines 88 and 90 are representative of a second series of lines. Each memory cell 41 is uniquely addressed by the combination of a line from the first series and a line from the second series. The memory cells may thus be configured as a memory array.

The embodiment of FIGS. 11-15 has conductive material 74 formed within openings 70-73 prior to formation of the bottom electrodes 28, and thus the bottom electrodes are spaced from conductive lines 18 and 20 by intervening material 74. In other embodiments the bottom electrodes may be formed directly on conductive lines 18 and 20. For instance, FIG. 16 shows construction 10 in accordance with an embodiment analogous to that of FIG. 15, but in which bottom electrodes 28 have been formed directly against the conductive lines 18 and 20. In the shown embodiment of FIG. 16, the dielectric material 22 is much thinner than in the embodiment of FIG. 15 so that the bottom electrodes 28 may be about the same thickness in both the embodiment of FIG. 15 and that of FIG. 16. Although it can be desired to keep the bottom electrodes thin (for instance, less than or equal to about 50 angstroms) due to the relatively expensive materials that may be preferred for such electrodes (for instance, platinum), there may be applications in which thicker bottom electrodes are desired.

Another embodiment is described with reference to FIGS. 17-20. Identical numbering will be used to describe FIGS. 17-20 as is used above in describing FIGS. 1-16, where appropriate.

FIG. 17 shows construction 10 at a processing stage analogous to that of FIG. 8. Openings 50-53 have been formed in dielectric material 22, and memory cell plugs 110-113 have been formed within the openings 50-53, respectively. The memory cell plugs comprise multivalent metal oxide 33 over bottom electrodes 28, with such electrodes comprising the electrode material 25.

The construction of FIG. 17 may be fabricated by any suitable method. For instance, electrode material 25 may be deposited at the bottoms of the openings 50-53 to partially fill the openings, and subsequently material 33 may be deposited within the partially filled openings. If material 33 overfills the openings, CMP may be utilized to remove excess material 33 from over dielectric material 22. The CMP may form the shown substantially planar upper surface 91 extending across dielectric material 22 and across the plugs 110-113.

Referring to FIG. 18, an expanse of high k dielectric material 31 is formed across surface 91, and a dielectric mass 92 is formed over the high k dielectric material.

The expanse of high k dielectric material extends entirely across the upper surface of construction 10, and thus extends across all of the plugs 110-113.

In the shown embodiment the high k dielectric material 31 is formed conformally over the substantially planar upper surface 91, and thus such programmable material forms a substantially planar expanse across surface 91.

The high k dielectric material 31, together with the multivalent metal oxide 33, forms regions of programmable material 30 over the bottom electrodes 28.

The dielectric mass 92 is shown to comprise a relatively thin lower portion comprising a material 94, and a relatively thick upper portion comprising a material 96. The bifurcation of dielectric mass 92 between two portions can be of benefit in a subsequent etch, as described below with reference to FIG. 19.

The material 94 may comprise a low k dielectric film, such as, for example, a film containing silicon, carbon and nitrogen. The material 94 may be formed to any suitable thickness, and in some embodiments may have a thickness of less than about 100 angstroms, less than about 50 angstroms, or even less than about 30 angstroms.

The material 96 may comprise any suitable composition or combination of compositions, and may, for example, comprise, consist essentially of, or consist of one or more of silicon dioxide, doped silicon oxide, silicon nitride, etc. The material 96 may be formed to any suitable thickness, and in some embodiments may be formed to a thickness within a range of from about 200 angstroms to about 1500 angstroms.

In some embodiments the thin material 94 may be referred to as a protective layer, and the thick material 96 may be referred to as thick dielectric formed over the protective layer.

Referring to FIG. 19, trenches 98 and 100 are formed through dielectric mass 92 to expose upper an upper surface of high k dielectric material 31. Trenches 98 and 100 may be formed with any suitable processing. In some embodiments, a photolithographically-formed mask (not shown) may be provided over mass 92 to define locations of the trenches, and the trenches may then be etched into mass 92 with a two-step process. Specifically, an aggressive first etch may be utilized to rapidly etch through the thick material 96 of mass 92, and then a less aggressive second etch may be utilized to punch through the thin material 94. It may be desired to use a less aggressive etch for exposing the upper surface of material 31 in order to avoid damaging such upper surface.

Referring to FIG. 20, top electrode material 35 is formed at the bottoms of trenches 98 and 100, and subsequently conductive lines 102 and 104 are formed over the top electrode material. The conductive lines 102 and 104 comprise the same materials 17, 19 and 21 discussed above with reference to FIG. 2 as being incorporated into lines 18 and 20, and may be formed with a damascene process analogous to that discussed above with reference to FIG. 2.

The conductive lines 102 and 104 extend along the axis 2, while the conductive lines 18 and 20 extend along the axis 1. Memory cells 41 are at cross-points where lines 102 and 104 cross lines 18 and 20. The lines 18 and 20 may be considered representative of a first series of lines while the lines 102 and 104 are representative of a second series of lines. Each memory cell is uniquely addressed by the combination of a line from the first series and a line from the second series. The memory cells may thus be configured as a memory array.

Figure 21:
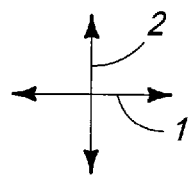
FIG. 21 is a diagrammatic cross-sectional side view of a semiconductor wafer construction at a processing stage subsequent to that of FIGS. 20A-20C in accordance with an example embodiment.
Figure 21:
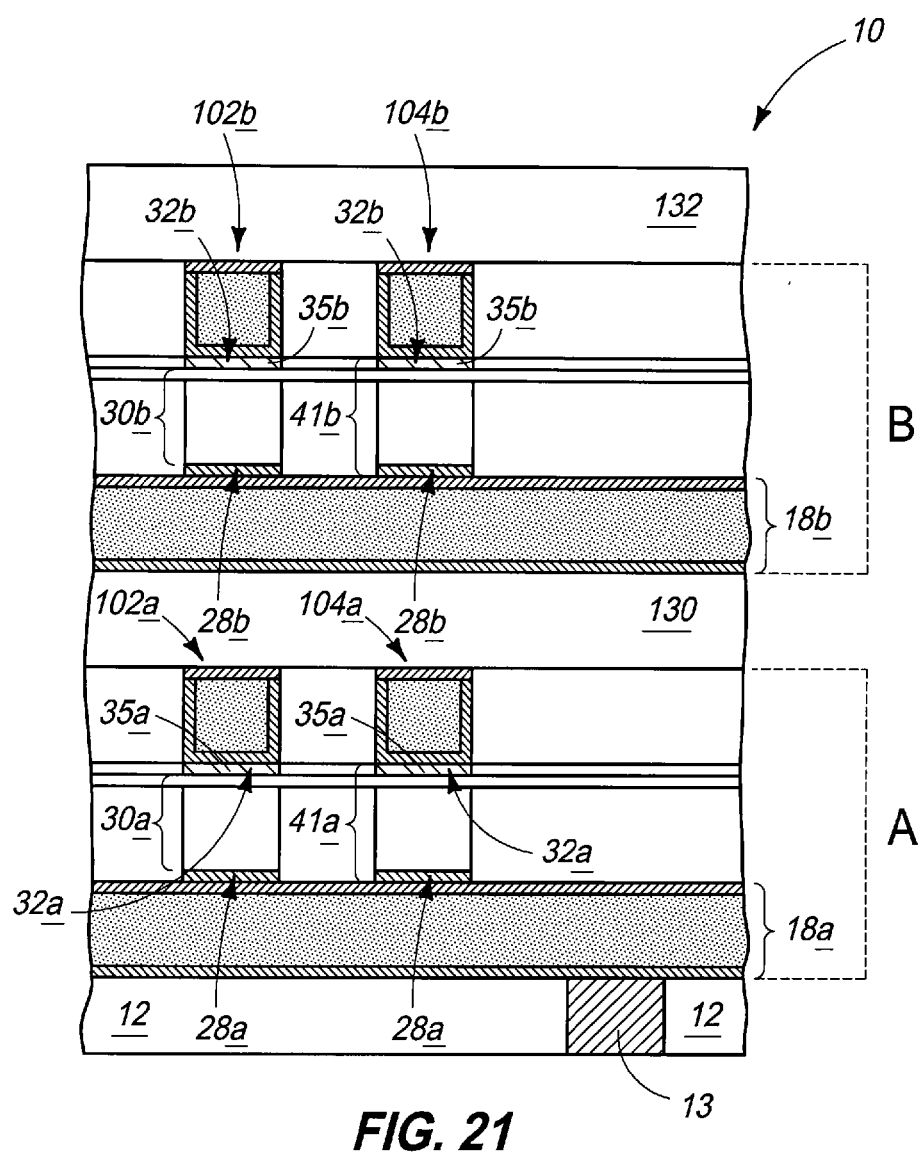
Figure 22A:
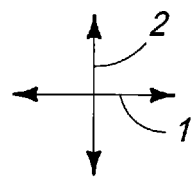
FIG. 22A is a diagrammatic top view of a portion of a semiconductor construction at a process stage of an example embodiment process for forming a memory array.
Figure 22A:
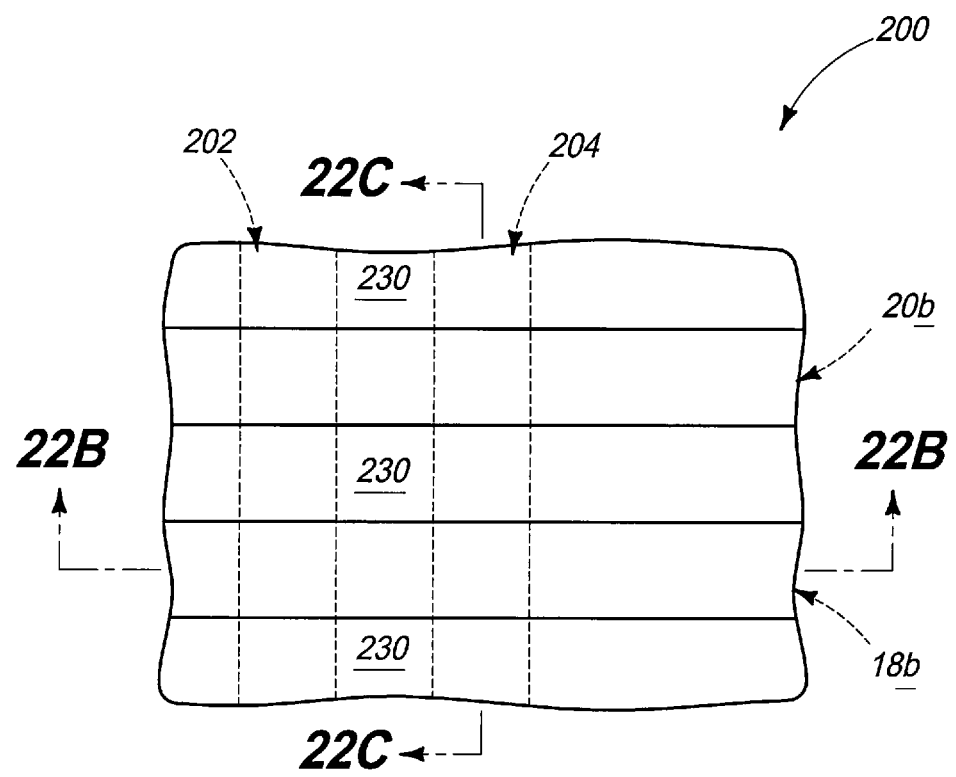
Figure 22B:
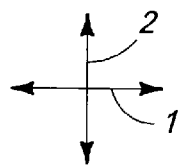
FIGS. 22B and 22C are diagrammatic cross-sectional side views along the lines 22B-22B and 22C-22C, respectively, of FIG. 22A. Also.
Figure 22B:
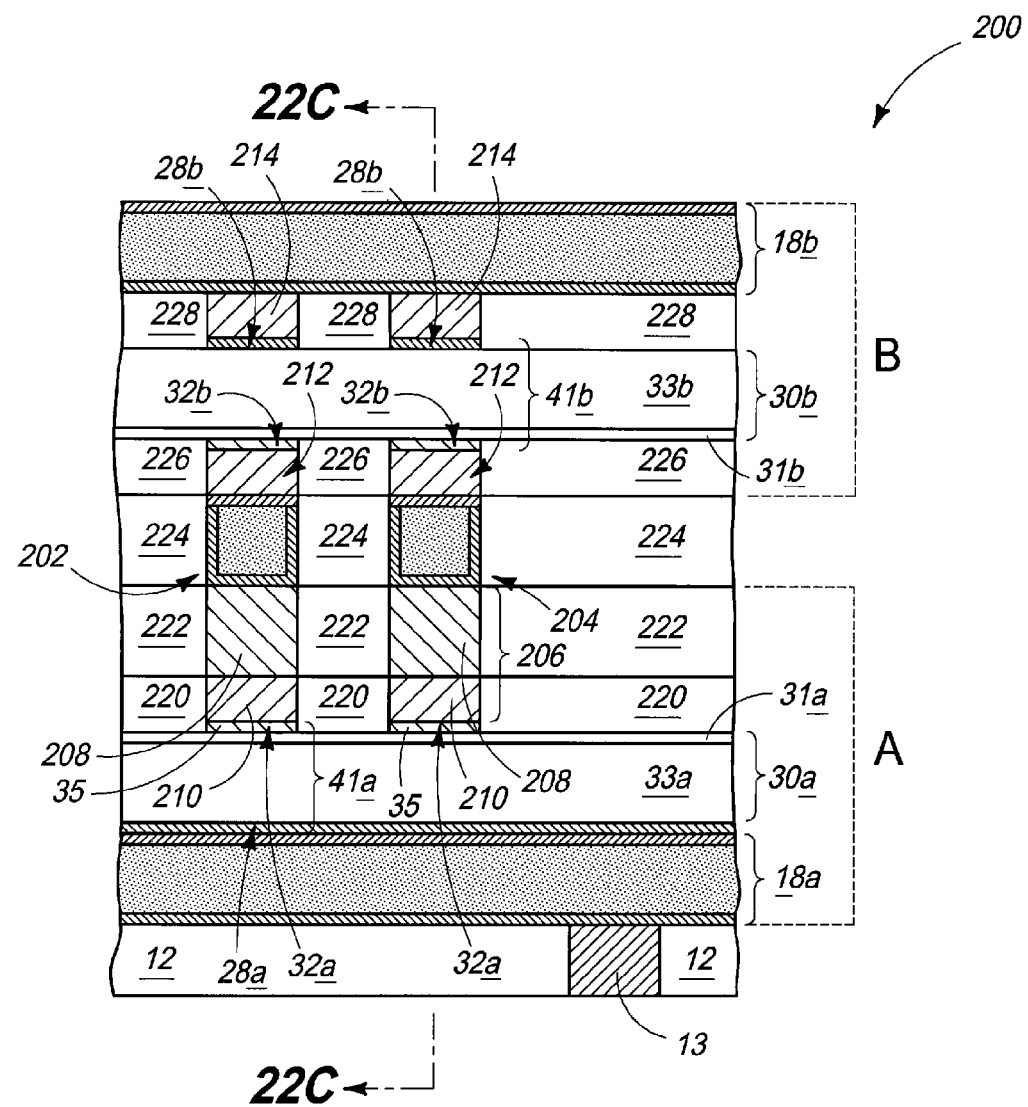
Figure 22C:
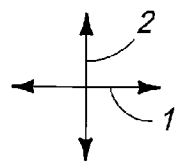
Figure 22C:
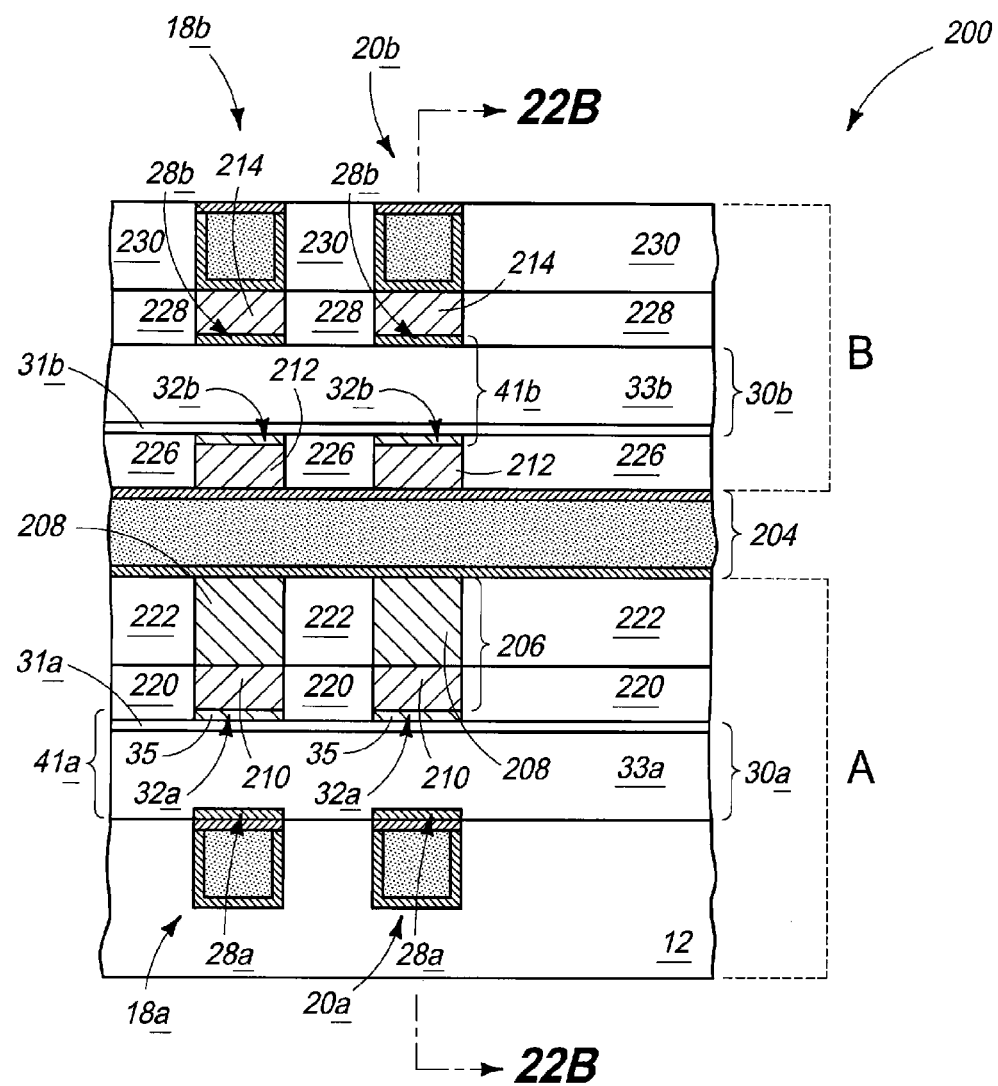
Figure 23A:
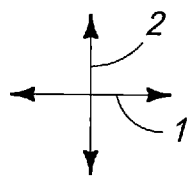
FIG. 23A is a diagrammatic top view of a portion of a semiconductor construction at a process stage of an example embodiment process for forming a memory array.
Figure 23A:
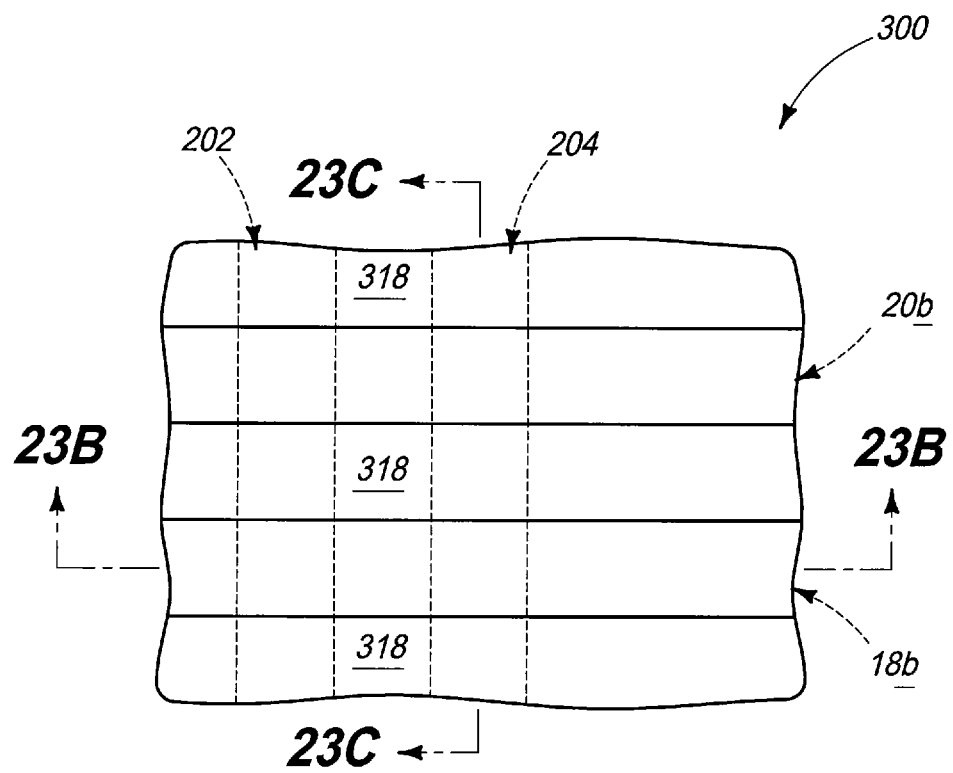
Figure 23B:
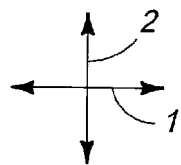
FIGS. 23B and 23C are diagrammatic cross-sectional side views along the lines 23B-23B and 23C-23C, respectively, of FIG. 23A. Also.
Figure 23B:
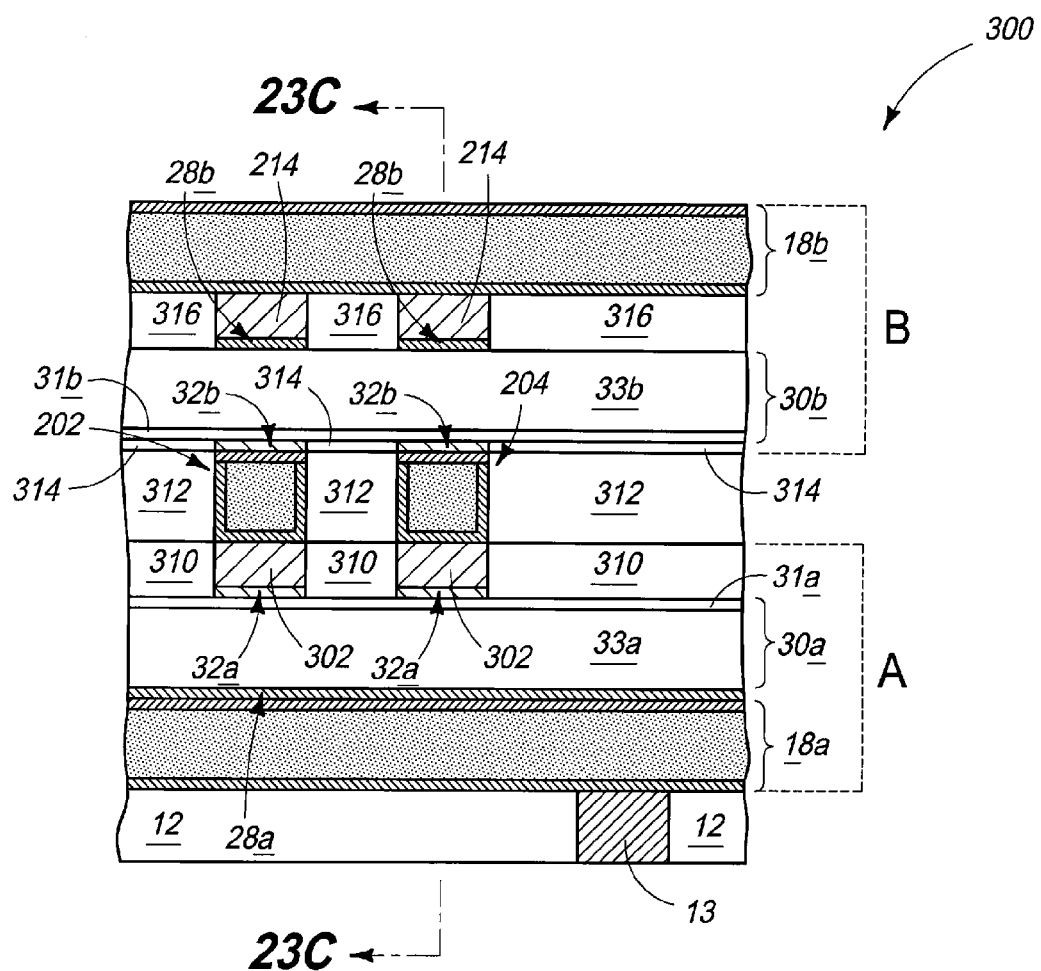
Figure 23C:
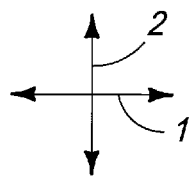
Figure 23C:
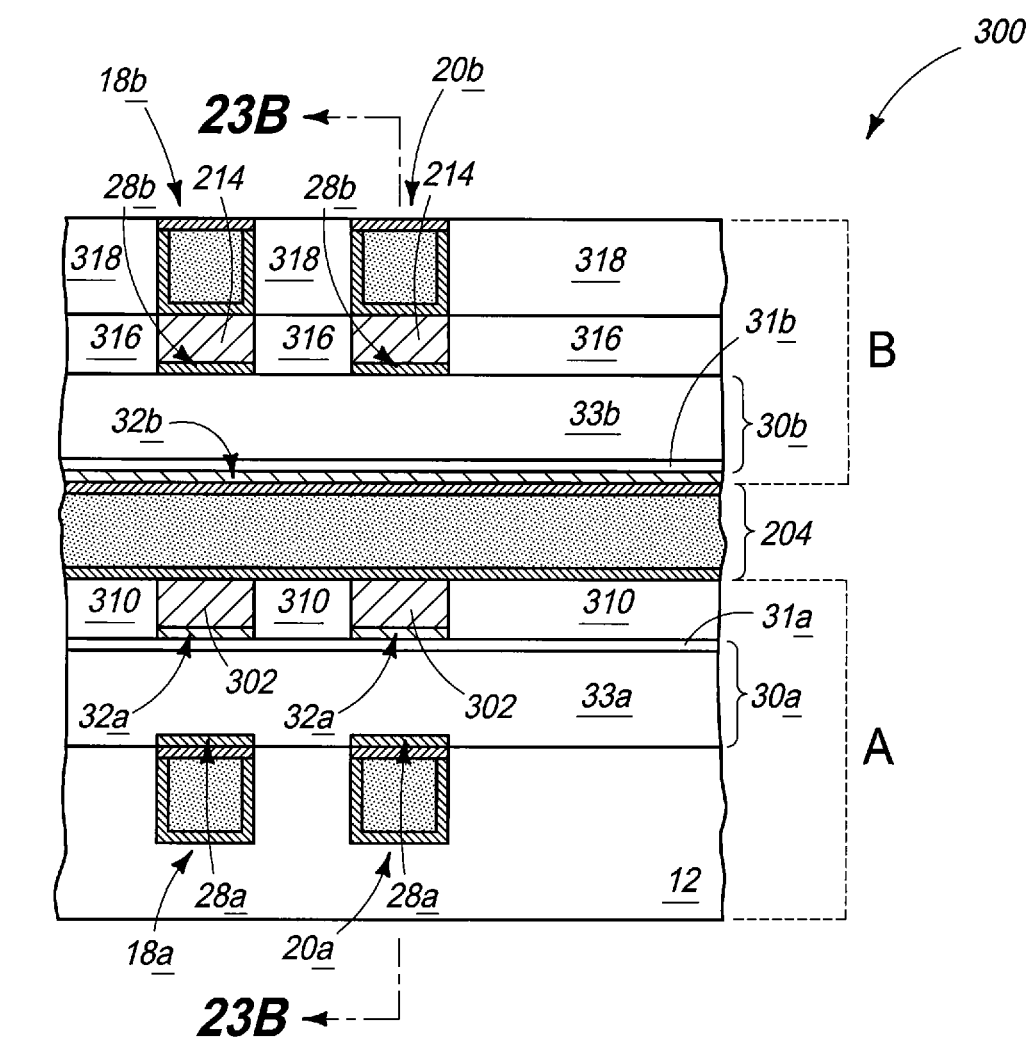

In some embodiments, memory arrays of the type shown in FIG. 20 may be stacked across numerous vertical levels analogously to the stacking described above with reference to FIG. 6. FIG. 21 shows construction 10 at a processing stage subsequent to that of FIG. 20, and shows two levels (A and B) of a memory array. Each level includes a volume of programmable material (30a and 30b) between a pair of top and bottom electrodes (the bottom electrodes are 28a and 28b, and the top electrodes are 32a and 32b). Each level also includes lower conductive lines extending along axis 1 (the lower conductive lines are 18a and 18b), and upper conductive lines extending along the axis 2 (the upper conductive lines are lines 102a, 104a, 102b and 104b). Dielectric material 130 is utilized to separate the levels from one another, and dielectric material 132 is utilized to separate level B from other circuitry (not shown) that may be subsequently formed over level B.

In some embodiments the configuration of FIG. 21 may be considered to comprise a memory array having vertically-stacked levels of rows and columns. For instance, lines 18a and 18b may be considered to correspond to two vertically-stacked levels of columns, and lines 102a, 102b, 104a and 104b may be considered to correspond to two vertically-stacked levels of rows. The rows and columns may be utilized for uniquely addressing every memory cell in the array.

Another embodiment is described with reference to FIG. 22. Identical numbering will be used to describe FIG. 22 as is used above in describing FIGS. 1-21, where appropriate.

FIG. 22 shows a construction 200 comprising a memory array. The memory array has two vertical levels A and B (FIGS. 22B and 22C) which are of inverted orientation relative to one another. Specifically, level A is configured around a dual-layer programmable material 30a having a high k dielectric material (31a) over a multivalent material (33a), while level B is configured around a dual-layer programmable material 30b having a high k dielectric material (31b) under a multivalent material (33b).

The programmable material 30a is sandwiched between electrodes 28a and electrodes 32a in level A to form a plurality of memory cells 41a; and similarly the programmable material 30b is sandwiched between electrodes 28b and electrodes 32b in level B to form a plurality of memory cells 41b.

Construction 200 includes column lines 18 and 20 electrically connected to the electrodes 28, and extending along axis 1. Specifically vertical level A has lines 18a and 20a connected to electrodes 28a, and vertical level B has lines 18b and 20b connected to electrodes 28b.

Construction 200 also includes row lines 202 and 204 electrically connected to the electrodes 32a and 32b. In the shown embodiment a single set of row lines is shared between the vertical levels A and B.

The row lines and column lines of FIG. 22 may be utilized for uniquely addressing every memory cell in the array.

In the shown embodiment, the lines 202 and 204 connect with electrodes 32a through electrically conductive pillars 206 that comprise two different materials 208 and 210. The bottom material 210 may correspond to patterned hard mask material analogous to the material 76 described above with reference to FIG. 13. The upper material 208 may be any suitable electrically conductive material, including, for example, one or more of various metals (for instance, tungsten, titanium, etc.), metal-containing compositions, and conductively-doped semiconductor materials.

The lines 202 and 204 connect with electrodes 32b through electrically conductive pillars 212. The pillars 212 may comprise any suitable electrically conductive material or combination of materials, and may, for example, comprise one or more of various metals, metal-containing compositions, and conductively-doped semiconductor materials.

In the shown embodiment, electrodes 28a are shown to be directly against conductive lines 18a and 20a of level A, and electrodes 28b are shown to be electrically connected to conductive lines 18b and 20b of level B through electrically conductive interconnects 214. Such interconnects may comprise any suitable electrically conductive material or combination of materials, and may, for example, comprise one or more of various metals, metal-containing compositions, and conductively-doped semiconductor materials. Although interconnects 214 are utilized for connecting the electrodes 28a to conductive lines at level B and not for connecting electrodes 28a to the lines at level A in the shown embodiment, in other embodiments the conductive interconnects may be omitted from level B, added to level A, or utilized in any other suitable configuration.

Numerous dielectric materials 220, 222, 224, 226, 228 and 230 are shown utilized in construction 200 for providing electrical isolation between various components. Such dielectric materials may comprise any suitable compositions or combinations of compositions, including, for example, one or more of silicon dioxide, various doped oxides, silicon nitride, silicon oxynitride, etc. Although the adjacent dielectric materials are shown to be distinguishable from one another in the diagrams of FIGS. 22B and 22C, such is for illustrative purposes only. In practice the adjacent dielectric materials may have a same composition as one another, and may thus merge so that there are no distinguishable boundaries between them.

The programmable materials 30a and 30b are expanses extending across numerous memory cells. If such programmable materials comprise phase change materials, it may be advantageous to amorphize the programmable material within intervening regions between the memory cells to reduce or eliminate cross-talk between adjacent memory cells. Such amorphization may be conducted with an amorphizing implant utilizing methodology analogous to that discussed above with reference to FIG. 5.

Construction 200 may be fabricated with any suitable methodology, including methodology utilizing various techniques of the types described above with reference to FIGS. 1-21.

An example method for forming construction 200 is as follows. Initially, first conductive lines 18a and 20a are formed to extend along the first axis 1. The electrode material 25 is then formed along the lines 18a and 20a to form the electrodes 28a. The expanse of programmable material 30a is then formed over and in direct contact with the electrodes 28a. Electrode material 35 and patterned electrically conductive hard mask material 210 are formed over the programmable material, and the hard mask material is utilized to pattern electrodes 32a from the material 35. Electrically conductive structures are then formed over the electrically conductive hard mask material 210; with the electrically conductive structures including the pedestals 208, the conductive lines 202 and 204, the pedestals 212, and the electrodes 32b atop the pedestals 212. The expanse of programmable material 30b is formed over and in direct contact with the electrodes 32b, and the electrodes 28b are formed over and directly against the programmable material 30b. Finally, the pedestals 214 are formed over electrodes 28b, and the conductive lines 18b and 20b are formed over the pedestals 214.

Another embodiment is described with reference to FIG. 23. The embodiment of FIG. 23 is similar to that of FIG. 22, and identical numbering will be used to describe FIG. 23 as is used above in describing FIG. 22, where appropriate.

FIG. 23 shows a construction 300 comprising a memory array. The memory array has two vertical levels A and B (FIGS. 23B and 23C) which are of inverted orientation relative to one another. Specifically, level A is configured around the dual-layer programmable material 30a having a high k dielectric material (31a) over a multivalent material (33a), while level B is configured around the dual-layer programmable material 30b having a high k dielectric material (31b) under a multivalent material (33b).

Construction 300 includes the lines 18a, 18b, 20a, 20b, 202 and 204 discussed above with reference to FIG. 22. Like the embodiment of FIG. 22, the construction of FIG. 23 has lines 18a and 20a directly adjacent electrodes 28a, and has lines 18b and 20b connected to electrodes 28b through conductive interconnects 214. Construction 300 differs from the embodiment of FIG. 22 in that construction 300 has the lines 202 and 204 electrically connected to electrodes 32a through single interconnects 302, and has the lines 202 and 204 directly adjacent to the electrodes 32b.

The interconnects 302 may correspond to patterned hard mask material analogous to the material 76 described above with reference to FIG. 13.

The electrodes 32b are formed in a dielectric material 314 (FIG. 23B) that may be identical to the material 94 discussed above with reference to FIG. 18.

Construction 300 is shown to comprise numerous dielectric materials 310, 312, 314, 316 and 318 for providing electrical isolation between various components. Such dielectric materials may comprise any suitable compositions or combinations of compositions, including, for example, one or more of silicon dioxide, various doped oxides, silicon nitride, silicon oxynitride, etc.

Construction 300 may be fabricated with any suitable methodology, including methodology utilizing various techniques of the types described above with reference to FIGS. 1-22.

The embodiments discussed above may be utilized to form memory arrays suitable for incorporation into integrated circuitry. Such integrated circuitry may be utilized in any of a wide variety of electronic systems; including, for example, computers, cars, airplanes, clocks, cellular phones, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An array of memory cells, comprising:
   a plurality of first conductive lines extending along a first axis;
   spaced-apart programmable material lines extending across the first conductive lines; each of the programmable material lines comprising a high k dielectric portion directly against a multivalent metal oxide portion; the programmable material lines extending along a second axis which intersects the first axis;
   spaced-apart segments of first electrode material over the first conductive lines;
   the multivalent metal oxide of the programmable material lines being directly against the segments of the first electrode material;
   lines of second electrode material over and directly against the high k dielectric portions of the programmable material lines; and
   a plurality of second conductive lines extending along the first axis and being directly against the second electrode material.

2. The array of claim 1 wherein each of the programmable material lines has a thickness of the high k dielectric portion that is less than or equal to about one-fourth of a thickness of the individual multivalent metal oxide portion.

3. The array of claim 1 wherein the high k dielectric portions are configured as upwardly-opening containers, and wherein the second electrode lines are within the upwardly-opening containers.

4. The array of claim 3 wherein the high k dielectric portions consist of yttrium-doped zirconium oxide.

5. The array of claim 4 wherein the high k dielectric portions comprise thicknesses within a range of from greater than 0 angstroms to less than or equal to about 50 angstroms.

6. The array of claim 1 further comprising select devices between the first electrode material segments and the first conductive lines.

7. The array of claim 6 wherein the select devices are Schottky diodes.

8. The array of claim 1 wherein the second axis is substantially orthogonal to the first axis.

9. An array of memory cells, comprising:
   first conductive lines extending along a first axis;
   first electrode material along the first conductive lines;
   an expanse first programmable material over and in direct contact with the first electrode material; the expanse of first programmable material extending across a plurality of the first conductive lines; the first programmable material comprising a first high k dielectric portion over and directly against a first multivalent metal oxide portion;
   spaced-apart electrically conductive structures over the first programmable material, the electrically structures having bottom portions that include conductive pedestals containing bases of second electrode material that are directly against the first high k dielectric portion; the first programmable material comprising first cell regions directly beneath the second electrode material bases, and comprising first intervening regions between the first cell regions; the electrically conductive structures including second conductive lines that extend along a second axis which is substantially perpendicular to the first axis; the electrically conductive structures having upper pedestals, the upper pedestals having caps corresponding to third electrodes;
   an expanse of second programmable material over and in direct contact with the third electrode caps; the expanse of second programmable material extending across a plurality of the third electrode caps; the second programmable material comprising a second multivalent metal oxide portion over and directly against a second high k dielectric portion;
   fourth electrodes directly against the second programmable material; the second programmable material comprising second cell regions directly beneath the fourth electrodes, and comprising second intervening regions between the second cell regions; and
   third conductive lines extending across the fourth electrodes, the third conductive lines extending along the first axis.

10. The array of claim 9 comprising additional pedestals over and directly against the fourth electrodes; and wherein the third conductive lines are over and directly against said additional pedestals.

11. The array of claim 9 wherein the first and second multivalent metal oxide portions within the first and second intervening regions of the first and second programmable materials are more amorphous than the first and second metal oxide portions within the first and second cell regions.

* * * * *